US008142895B2

(12) United States Patent
Khanarian et al.

(10) Patent No.: US 8,142,895 B2
(45) Date of Patent: *Mar. 27, 2012

(54) HEAT STABLE ARYL POLYSILOXANE COMPOSITIONS

(75) Inventors: Garo Khanarian, Princeton, NJ (US); David Wayne Mosley, Philadelphia, PA (US)

(73) Assignee: Rohm and Haas Company, Philadelphia, PA (US)

( * ) Notice: Subject to any disclaimer, the term of this patent is extended or adjusted under 35 U.S.C. 154(b) by 84 days.

This patent is subject to a terminal disclaimer.

(21) Appl. No.: 11/974,063

(22) Filed: Oct. 11, 2007

(65) Prior Publication Data

US 2008/0090986 A1   Apr. 17, 2008

Related U.S. Application Data

(60) Provisional application No. 60/851,945, filed on Oct. 16, 2006.

(51) Int. Cl.
B32B 9/04 (2006.01)
C08G 77/04 (2006.01)

(52) U.S. Cl. ............. 428/447; 528/15; 528/31; 528/32; 528/43

(58) Field of Classification Search ............ 528/15
See application file for complete search history.

(56) References Cited

U.S. PATENT DOCUMENTS

| | | | | |
|---|---|---|---|---|
| 2,915,497 | A | * | 12/1959 | Clark ............... 525/478 |
| 3,020,260 | A | * | 2/1962 | Nelson ............. 528/15 |
| 3,697,473 | A | | 10/1972 | Polmanteer et al. |
| 3,957,713 | A | * | 5/1976 | Jeram et al. ........ 524/703 |
| 4,477,641 | A | | 10/1984 | Matsumoto |
| 4,537,943 | A | | 8/1985 | Talcott |
| 4,719,275 | A | | 1/1988 | Benditt et al. |
| 5,204,435 | A | | 4/1993 | Kozakai et al. |
| 5,548,038 | A | | 8/1996 | Enami et al. |
| 6,432,137 | B1 | | 8/2002 | Nanushyan et al. |
| 6,806,509 | B2 | | 10/2004 | Yoshino et al. |
| 6,815,520 | B2 | | 11/2004 | Yoneda et al. |
| 7,469,059 | B1 | * | 12/2008 | Lefevere et al. ..... 382/166 |
| 7,705,104 | B2 | * | 4/2010 | Yamakawa et al. ... 528/31 |
| 7,960,192 | B2 | * | 6/2011 | Thompson et al. ... 438/22 |

| | | | |
|---|---|---|---|
| 2004/0116640 | A1 | * 6/2004 | Miyoshi ............. 528/12 |
| 2005/0137328 | A1 | 6/2005 | Staiger et al. |
| 2005/0212008 | A1 | 9/2005 | Miyoshi |
| 2006/0057297 | A1 | 3/2006 | Chevalier et al. |
| 2006/0081864 | A1 | 4/2006 | Nakazawa |
| 2006/0134440 | A1 | * 6/2006 | Crivello ............ 428/447 |

FOREIGN PATENT DOCUMENTS

| | | |
|---|---|---|
| EP | 1424363 A1 * | 6/2004 |
| EP | 1 424 363 | 2/2007 |
| EP | 1 801 163 | 6/2007 |
| WO | WO 03/035763 | 5/2003 |
| WO | WO 2004/037927 | 5/2004 |
| WO | WO 2005/033207 | 4/2005 |

OTHER PUBLICATIONS

European Search Report of corresponding European Application No. 07 25 3947 mailed Feb. 5, 2008.
Oh et al., "Synthesis, Characterization, and Surface Immobilization of Metal Nanoparticles Encapsulated within Bifunctionalized Dendrimers", Langmuir 2003, 19, pp. 10420-10425.
Ghannoum et al., "Self-Assembly of Polyacrylate-Capped Platinum Nanoparticles on a Polyelectrolyte Surface: Kinetics of Adsorption and Effect of Ionic Strength and Deposition Protocol", Langmuir 2003, 19, pp. 4804-4811.
Zhao et al., "Preparation, Phase Transfer, and Self-Assembled Monolayers of Cubic Pt. Nanoparticles", Langmuir 2002, 18, pp. 3315-3318.
Lewis et al., "In Situ Detection of Platinum Species in Hydrosilylation Reactions: Reactions: The Use of CO and $PPh_3$ as Probes", General Electric Corporate Research and Development Report No. 96CRD171, Dec. 1996, 13 pages.
Lewis et al., "Synthesis and Activity of Pt Catalysts Used in the Silicones Industry", General Electric Corporate Research and Development Report No. 97CRD160, Dec. 1997, 9 pages.
Stein et al., "In Situ Determination of Active Catalyst in Hydrosilylation Reactions Using Highly Reactive Pt(O) Catalyst Precursors", General Electric Corporate Research and Development Report No. 98CRD115, Sep. 1998, 29 pages.

* cited by examiner

Primary Examiner — Marc Zimmer
(74) Attorney, Agent, or Firm — Jonathan D. Baskin

(57) ABSTRACT

A curable aryl siloxane composition is disclosed. A heat stable cured aryl polysiloxane composition is further disclosed, along with a method of making that heat stable cured aryl polysiloxane composition from the curable aryl siloxane composition. An encapsulated semiconductor device, and a method of making that encapsulated semiconductor device by coating a semiconductor element of a semiconductor device with the heat stable cured aryl polysiloxane are further disclosed.

8 Claims, No Drawings

HEAT STABLE ARYL POLYSILOXANE COMPOSITIONS

This application claims the benefit of priority under 35 U.S.C. §119(e) of U.S. Provisional Patent Application No. 60/851,945 filed on Oct. 16, 2006.

The present invention relates to a curable aryl siloxane composition, to a method of making a heat stable cured aryl polysiloxane composition therefrom, and to that heat stable cured aryl polysiloxane composition, as well as to an encapsulated semiconductor device, and a method of making that encapsulated semiconductor device by coating a semiconductor element of a semiconductor device with the heat stable cured aryl polysiloxane composition.

The next generation of high intensity light emitting diodes (LEDs) that is being developed for industrial and residential lighting applications will require a new class of encapsulants. There have been no viable encapsulant alternatives that can perform continuously without loss of desirable characteristics under long term (10,000 hrs-100,000 hrs) and high temperature (100° C.-200° C.) operating conditions. Currently available epoxy polymeric encapsulants undergo unacceptable yellowing and degradation under the strenuous operating conditions employed for high intensity LEDs. Further, it is preferred, and may be required, that any new candidate encapsulant be compatible with current encapsulant production methodologies.

A class of polysiloxanes has been found to offer advantages as encapsulant for high intensity lighting devices when compared with epoxy polymers. Methyl substituted polysiloxanes are particularly resistant to degradation and concomitant coloring when exposed to high temperature conditions in air. This attribute of methyl substituted polysiloxanes is, however, more than offset by low refractive index (RI~1.41), a characteristic inherent in the composition of such polysiloxanes. A low refractive index methyl substituted polysiloxane affixed to a high refractive index luminous surface (RI~2.5) of an LED light generating stack creates an interface resistant to efficient flow of light from its point of generation within that LED stack to the outside environment requiring illumination.

Because decreasing the difference in refractive index between the LED stack and the encapsulant increases escape of light from the LED stack and, hence, LED efficiency, it is desirable to increase the refractive index of the polysiloxane. One approach to increasing the refractive index of a polysiloxane is to attach aryl groups to the silicon atoms. Attaching aryl groups to silicon can elevate the refractive index of a polysiloxane into the range 1.5-1.62. When used as an encapsulant for an LED, an aryl substituted polysiloxane, therefore, provides superior efficiency of light flow relative to a methyl substituted polysiloxane.

Unfortunately, aryl polysiloxanes are known to yellow under mild to moderate accelerated heat aging conditions, and to turn brown under stringent accelerated heat aging conditions. This degradation has rendered aryl polysiloxanes unsuitable as encapsulants for high intensity LEDs. Patent publication WO2005/033207 A1 discloses levels of 0.1 to 500 ppm of Pt as sufficient to catalyze hydrosilation in curable organopolysiloxane compositions having aryl substituents. WO2005/033207 A1 further teaches that curing those aryl organopolysiloxanes with catalysts imparting platinum content above the upper limit of the range (i.e., greater than 500 ppm Pt metal) may cause problems to arise in terms of imparting various colors to the resultant cured product. Although an approximate upper limit of 500 ppm was suggested for Pt metal content during curing of aryl organopolysiloxane specimens, there is no recognition of any deleterious effect of accelerated aging at elevated temperature in air upon samples having levels of platinum metal of 500 ppm or lower. In those instances where experimental examples were cured and tested for loss of light transmission, those examples were cured at 150° C. for one hour, and heat aged at 150° C. for 100 hours. Both curing and aging were carried out in a hot air circulating oven. Of course, since there was no accelerated heat aging at temperatures indicative of long term high brightness LED use conditions, there was no disclosure as to whether all, none, or some of the Pt metal levels in the range 0.1 to 500 ppm might promote survival of aryl organopolysiloxanes under high brightness LED use conditions.

We have surprisingly discovered that a curable aryl siloxane composition including an aryl vinyl polysiloxane and a hydrido silicon compound, at least one of which bears one or more aryl groups, and a hydrosilation catalyst present in an amount of at least 0.005 ppm to no more than 3.0 ppm, expressed as a Group VIII element equivalent value, based on the total weight of siloxanes in the curable aryl siloxane composition, produces upon curing a cured aryl polysiloxane composition that does not discolor during accelerated heat aging during two weeks at 200° C. in air.

One aspect of the present invention is directed to a cured aryl polysiloxane composition including:
 A. an alkylene bridged aryl polysiloxane including:
   at least one silicon-bridging alkylene moiety; and from at least 10 mole percent to no more than 99.9 mole percent silicon bonded aryl groups, based on total moles of silicon bonded organic groups of the alkylene bridged aryl polysiloxane; and
 B. a hydrosilation catalyst, wherein the hydrosilation catalyst is a metal or metal compound including a Group VIII element selected from platinum, rhodium, palladium, and combinations thereof; and
   the hydrosilation catalyst, and any derivatives thereof, is present in a combined amount of at least 0.005 ppm to no more than 3.0 ppm, expressed as a Group VIII element equivalent value, based on the weight of the cured aryl polysiloxane composition; and
 wherein the cured aryl polysiloxane composition does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured aryl polysiloxane composition after the heat aging.

A second aspect of the present invention is directed a method of making the cured aryl polysiloxane composition of the first aspect of the present invention, including the steps of:
 A. providing:
   i) an aryl alkenyl polysiloxane including:
     at least two silicon bonded alkenyl groups; and
     from at least 10 mole percent to no more than 99.9 mole percent silicon bonded aryl groups, based on total moles of silicon bonded organic groups of the aryl alkenyl polysiloxane;
   ii) a hydrido silicon compound including:
     at least two silicon bonded hydrogen atoms; and
     from 0 mole percent to no more than 99.9 mole percent of the silicon bonded aryl groups, based on total moles of silicon bonded organic groups of the hydrido siloxane compound; and
   iii) a hydrosilation catalyst;
 B. combining the aryl alkenyl polysiloxane, the hydrido silicon compound, and the hydrosilation catalyst to produce a curable aryl siloxane composition;

C. curing the curable aryl siloxane composition to form the cured aryl polysiloxane composition; and
D. optionally, purifying the cured aryl polysiloxane composition by a technique including steps selected from: removing at least a portion of the hydrosilation catalyst; deactivating at least a portion of the hydrosilation catalyst; and combinations thereof,
wherein:
the hydrosilation catalyst is a metal or metal compound including a Group VIII element selected from platinum, rhodium, palladium, and combinations thereof;
the hydrosilation catalyst is present in an amount of at least 0.005 ppm to no more than 3.0 ppm, expressed as a Group VIII element equivalent value, based on the weight of the curable aryl siloxane composition; and
the cured aryl polysiloxane composition does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured aryl polysiloxane composition after the heat aging.

A third aspect of the present invention is directed to an encapsulated semiconductor device, including semiconductor elements, wherein one or more of the semiconductor elements is coated with the cured aryl polysiloxane composition of the first aspect of the present invention.

The terminology of this specification includes words specifically mentioned herein, derivatives thereof, and words of similar import.

Used herein, the following terms have these definitions:

The words "a" and "an" as used in the specification mean "at least one", unless otherwise specifically stated.

"Range". Disclosures of ranges herein take the form of lower and upper limits. There may be one or more lower limits and, independently, one or more upper limits. A given range is defined by selecting one lower limit and one upper limit. The selected lower and upper limits then define the boundaries of that particular range. All ranges that can be defined in this way are inclusive and combinable, meaning that any lower limit may be combined with any upper limit to delineate a range.

A "silicon bonded organic group" is an organic group bonded to a silicon atom, wherein an "organic group" contains at least one carbon, or is a hydrogen atom.

A "silicon bonded aryl group" ("silicon bonded aryl") is an aryl group having a carbon of an aromatic ring directly bonded to a silicon atom. Other silicon bonded organic groups include, for example: "silicon bonded alkylene group" ("silicon bonded alkylene"); "silicon bonded hydrogen atom"; "silicon bonded alkoxy group" ("silicon bonded alkoxy"); "silicon bonded aralkoxy group" ("silicon bonded aralkoxy"); and "silicon bonded hydroxy group" ("silicon bonded hydroxy").

The terms "mole percent" and "mol %" are used interchangeably throughout. The "mol % of silicon bonded aryl groups" for a given silicon compound, for example a siloxane or a silane, is the number of moles of silicon bonded aryl groups contained in that silicon compound, divided by the number of moles of all silicon bonded organic groups. For example, a hydrido silicon compound having 8 silicon bonded aryl groups and 2 silicon bonded hydrogen atoms, for a total of 10 silicon bonded organic groups, contains 80 mol % silicon bonded aryl groups, based on total silicon bonded organic groups of the hydrido silicon compound.

An "ethylenically unsaturated group-containing aryl polysiloxane" ("aryl alkenyl polysiloxane") includes at least two silicon bonded ethylenically unsaturated groups and from at least 10 mol % to no more than 99.9 mol % silicon bonded aryl groups, based on the total silicon bonded organic groups of the aryl vinyl polysiloxane. The term "alkenyl" is used herein as a shorthand form for "ethylenically unsaturated group". As such, it is understood that allylic groups (i.e., groups in which a carbon-carbon double bond is immediately adjacent to a —CH2-group or a —CHR— group) are included within the scope of the term "alkenyl".

A "hydrido silicon compound" includes at least two silicon bonded hydrogen atoms and from 0 mol % to no more than 99.9 mol % silicon bonded aryl groups, based on total silicon bonded organic groups, including hydrogen atoms, of the hydrido silicon compound.

The term "primary siloxane unit" refers to a portion of a polysiloxane containing a single silicon atom, wherein that silicon atom is directly bonded to between one and four oxygen atoms, and each of those oxygen atoms is, in turn bonded to another silicon atom of an adjacent primary siloxane unit. For example, $(CH_3)_3Si$—O—$Si(CH_3)_3$ is a polysiloxane having two primary siloxane units. Each primary siloxane unit has a single silicon atom bonded to three methyl groups and one oxygen, such that the oxygen atom is bound to both silicon atoms. Each of the two primary siloxane units of $(CH_3)_3Si$—O—$Si(CH_3)_3$ are defined infra as an "M-unit". In a second example, $(CH_3)_3Si$—O—$Si(CH_3)_2OH$ is also a polysiloxane having two primary siloxane units, each of which has a single silicon atom bonded to the same single oxygen atom wherein that oxygen atom is bonded to a second silicon atom. The oxygen of the hydroxy group is not bonded to second silicon atom and, as such, is not counted as a second oxygen atom for the purpose of determining if the primary siloxane unit to which it belongs is an M-unit or a D-unit. Therefore, the hydroxy group is treated as a silicon bonded organic group and the primary siloxane unit to which it belongs is an M-unit.

A "polysiloxane" is a siloxane having at least two primary siloxane units.

The term "M-unit" refers to a primary siloxane unit of a polysiloxane, wherein the silicon of that unit is attached to single, immediately adjacent, —O—Si— moiety through a covalent bond to the oxygen atom of that —O—Si— moiety.

Similarly, the terms "D-unit", "T-unit", and "Q-unit" refer, respectively, to a primary siloxane unit of a siloxane, wherein the silicon of that unit is attached to two, three, or four immediately adjacent —O—Si— moieties through a covalent bond to the oxygen atom of those —O—Si— moieties.

The term "ppm" means "parts per million" which, in turn, means "weight parts per million weight parts". Parts per million are weight based. Therefore, the amount of a given component x in a composition y is calculated by dividing the weight of component x by the weight of composition y and then multiplying by one million. For example, if 0.002 gram of platinum metal is present in 1000 grams of a cured aryl polysiloxane composition, the Pt metal is present at 2 ppm, based on the total weight of that cured aryl polysiloxane composition.

A "hydrosilation catalyst" includes a Group VIII element selected from platinum, rhodium, palladium, ruthenium, iridium, or combinations thereof, and is capable of catalyzing the addition of an Si—H group across the double bond of an ethylenically unsaturated group.

A "high RI nanoparticle" is a particle having a refractive index ("RI") of at least 1.8 to no more than 3.5. Plural high RI nanoparticles have an "average particle diameter" of at least 1 nm and no more 30 nm.

A "Group VIII element equivalent value" expresses the amount of a hydrosilation catalyst present in a siloxane composition in terms of the amount of Group VIII element present in that siloxane composition. If, for example, a given hydrosilation catalyst, itself containing 50 weight percent of a Group VIII element, is present in a siloxane composition in an amount of 10 ppm, then the amount of hydrosilation catalyst present in that composition, "expressed as a Group VIII element equivalent value", is 5 ppm.

A "curable aryl siloxane composition" includes: an aryl alkylene polysiloxane; a hydrido silicon compound; and a hydrosilation catalyst present in an amount of at least 0.005 ppm to no more than 3.0 ppm, expressed as a Group VIII element equivalent value, based on the total weight of siloxanes in the curable aryl siloxane composition. The curable aryl siloxane composition produces, upon curing, a cured aryl polysiloxane composition that does not discolor during the accelerated heat aging test.

A suitable "silicon-bridging alkylene moiety" is "—$CHR^4$—$CHR^5$—$X_s$—", wherein at least one of the two carbons derived from the carbon-carbon unsaturated bond by hydrosilation (i.e., the carbon to which $R^4$ is bound) is covalently bound to a silicon atom of the alkylene bridged aryl polysiloxane. The other carbon (i.e., the carbon to which $R^5$ is bound) may be bound directly to another silicon (subscript s=0) or bound to another silicon through X (subscript s=1), wherein X is selected from methylene, phenyl, and substituted phenyl. In this way, a larger "Si—$CHR^4$—$CHR^5$—$X_s$—Si moiety" is formed. The alkylene bridged polysiloxane of the present invention must include at least one silicon-bridging alkylene moiety.

An "alkylene bridged aryl polysiloxane" is a component of a cured aryl polysiloxane composition. An "alkylene bridged aryl polysiloxane" is a polysiloxane including: at least two silicon-bridging alkylene moieties; at least one unit derived from an aryl alkylene polysiloxane; and at least one unit derived from a hydrido silicon compound. At least 10 mol % to 100 mol % silicon bonded aryl groups, based on the total silicon bonded organic groups of the alkylene bridged aryl polysiloxane. An alkylene bridged aryl polysiloxane may include a "reactive silicon bonded organic group" including silicon bonded alkylene, silicon bonded hydrogen atom, silicon bonded alkoxy, silicon bonded aralkoxy, silicon bonded hydroxy, and combinations thereof. Alternatively, an alkylene bridged aryl polysiloxane may include no reactive silicon bonded organic groups.

A "capping agent" includes a single "capping moiety" capable of reacting with at least one reactive silicon bonded organic group. When it is desired to reduce the number of such reactive silicon bonded organic groups of a contemplated alkylene bridged aryl polysiloxane, a capping agent is added to the corresponding "curable aryl siloxane composition" from which that contemplated alkylene bridged aryl polysiloxane is to be made. Typically, the capping agent is added to the curable aryl siloxane composition before curing. Alternatively, the capping agent may be added during curing, or after curing, or portions of the capping agent may be added at various points before, during, and after the curing step. One of skill in the art will recognize that the feasibility of adding a "capping agent" after curing has begun will depend upon such factors as degree of crosslinking of the growing or fully formed alkylene bridged aryl polysiloxane, and the solubility and mobility of the capping agent in the curable aryl siloxane composition during and after curing, all of which influence the ability of the capping agent to diffuse so that capping will be uniform. The term "capped" means that a reactive silicon bonded organic group of a cured, or curing, curable aryl siloxane composition has been reacted with a capping agent capable of reacting with that reactive group. The "capping reaction" typically creates a new unreactive, or less reactive (i.e., "capped") end group. One of skill in the art will understand that, depending upon the specific characteristics of the alkylene bridged aryl polysiloxane, capping agent, other reacting species, the relative amounts of each, and other details of the "capping reaction" (e.g., time, temperature, and mixing), all, or fewer than all, of the reactive silicon bonded organic groups may be "capped".

A "cured aryl polysiloxane composition" includes: an alkylene bridged aryl polysiloxane; and a hydrosilation catalyst present in an amount of at least 0.005 ppm to no more than 3.0 ppm, expressed as a Group VIII element equivalent value, based on the weight of the cured aryl polysiloxane composition. The cured aryl polysiloxane composition does not discolor during the accelerated heat aging test of the present invention.

It is necessary that the cured aryl polysiloxane composition of the present invention is stable for extended times (thousands of hours) at use temperatures of 100° C. to 130° C., or even higher, in air. As a result, it is a specific requirement of the present invention that the cured aryl polysiloxane composition does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured aryl polysiloxane composition after the heat aging. This is the "accelerated heat aging test" of the present invention.

The "average particle size" determined for a collection of particles (i.e., plural particles) is the "weight average particle size", "$d_w$", as measured by Capillary Hydrodynamic Fractionation technique using a Matec CHDF 2000 particle size analyzer equipped with a HPLC type Ultra-violet detector. The terms "particle size", "particle diameter", and "PS" are used interchangeably herein. The terms "average particle size", "average particle diameter", "weight average particle size", "weight average particle diameter" and "$d_w$" are used interchangeably herein. The term "particle size distribution" and the acronym "PSD" are used interchangeably herein. "Polydispersity" is used in the art as a measure of the breadth of a distribution of values, in this case measured size values for a collection of particles. Used herein, "PSD polydispersity" is a description of the distribution of particle sizes for a plurality of particles. PSD polydispersity is calculated from the weight average particle size, $d_w$, and the number average particle size, $d_n$, according to the formulae:

$$PSD\ Polydispersity = (d_w)/(d_n),$$

where $d_n = \Sigma n_i d_i / \Sigma n_i$
$d_w = \Sigma n_i d_i d_i / \Sigma n_i d_i$, and
where $n_i$ is the number of particles having the particle size $d_i$.

Synthetic polymers are almost always a mixture of chains varying in molecular weight, i.e., there is a "molecular weight distribution", abbreviated "MWD". For a homopolymer, members of the distribution differ in the number of monomer units which they contain. This way of describing a distribution of polymer chains also extends to copolymers. Given that there is a distribution of molecular weights, the most complete characterization of the molecular weight of a given sample is the determination of the entire molecular weight distribution. This characterization is obtained by separating the members of the distribution and then quantifying the amount of each that is present. Once this distribution is in hand, there are several summary statistics, or moments, which can be generated from it to characterize the molecular weight of the polymer.

The two most common moments of the distribution are the "weight average molecular weight", "$M_w$", and the "number average molecular weight", "$M_n$". These are defined as follows:

$$M_w = \Sigma(W_i M_i)/\Sigma W_i = \Sigma(N_i M_i^2)/\Sigma N_i M_i$$

$$M_n = \Sigma W_i/\Sigma(W_i/M_i) = \Sigma(N_i M_i)/\Sigma N_i$$

wherein:
$M_i$=molar mass of $i^{th}$ component of distribution
$W_i$=weight of $i^{th}$ component of distribution
$N_i$=number of chains of $i^{th}$ component,
and the summations are over all the components in the distribution. $M_w$ and $M_n$ are typically computed from the MWD as measured by Gel Permeation Chromatography (see the Experimental Section). The "MWD polydispersity" is equal to $M_w/M_n$.

Estimation of whether a polymer and another component (e.g., another polymer, or a solvent or other small molecule) will be miscible may be made according to the well-known methods delineated in D. W. Van Krevelen, Properties of Polymers, $3^{rd}$ Edition, Elsevier, pp. 189-225, 1990. For example, Van Krevelen defines the total solubility parameter ($\delta t$) for a substance by:

$$\delta_t^2 = \delta_d^2 + \delta_p^2 + \delta_h^2,$$

wherein $\delta_d$, $\delta_p$, and $\delta_h$ are the dispersive, polar, and hydrogen bonding components of the solubility parameter, respectively. Values for $\delta_d$, $\delta_p$, and $\delta_h$ have been determined for many solvents, polymers, and polymer segments, and can be estimated using the group contribution methods of Van Krevelen. For example, to estimate whether a polymer having a given composition will be miscible with a particular solvent or other small molecule (e.g., having a molecular weight of approximately 500 or less), one calculates $\delta_t^2$ for the polymer and $\delta_t^2$ for the solvent. Typically, if the difference between the two, $\Delta\delta_t^2$, is greater than 25 (i.e., $\Delta\delta_t > 5$), then the polymer and the solvent will not be miscible.

If, instead, it is desired to determine whether two polymers, differing in composition, will be miscible, the same calculations may be carried out, but the predicted upper limit of $\Delta\delta t^2$ for miscibility will decrease as the molecular weight of one or both of the polymers under consideration increases. This decrease is thought to parallel the decrease in entropy of mixing which occurs as the molecular weight of the components being mixed increases. For example, two polymers, each having a degree of polymerization of 100, will likely be immiscible even if the value of $\Delta\delta t^2$ for their mixture is 9, or even 4 (i.e., $\Delta\delta t=3$, or even 2). Still higher molecular weight polymers may be immiscible at even lower values of $\Delta\delta t$. It is desirable that the aryl alkenyl polysiloxane and the hydrido silicon compound of the present invention, as well as the hydrosilation catalyst, are miscible in the curable aryl siloxane composition of the present invention. It is further desirable that any capping agent present in the curable aryl siloxane composition be miscible in the curable aryl siloxane composition. Without wishing to be bound by any particular theory, it is thought that miscibility of the components of the curable aryl siloxane composition leads to more uniform curing to give a more uniform cured aryl polysiloxane composition than if the components had not been miscible. To estimate whether an aryl alkenyl polysiloxane of the present invention, having a given composition, will be miscible with a particular hydrido silicon compound of the present invention, having another composition, one calculates $\delta t^2$ for each.

It will be understood that these calculations provide useful guidelines for one skilled in the art, greatly reducing the amount of experimentation required to achieve a desired result. It is, however, further recognized that the results of such calculations are estimates, and that some experimentation may be needed, in addition to those calculations, to determine particularly advantageous compositions for the curable aryl siloxane composition of the present invention. It is further understood that, when two components of the curable aryl siloxane composition display borderline miscibility, or even immiscibility, the selection of a third component miscible with each of those two components may be effective to product a solution in which all three components are miscible.

The hydrosilation catalyst of the present invention includes an element from Group VIII of the Periodic Chart of the Elements, present as a metal (i.e., in zero valent elemental form) or as a metal compound (i.e., a metal, in a positive valence state, associated with one or more counter ions; or in an organometallic complex), wherein the element is selected from: platinum, rhodium, palladium, ruthenium, iridium, and combinations thereof; platinum, rhodium, palladium, and combinations thereof; palladium, platinum, and combinations thereof; or platinum. A non-exhaustive list of platinum compounds includes: platinum black; platinum halides such as platinum (II) chloride, $PtCl_4$, $H_2PtCl_4 \cdot 6H_2O$, $Na_2PtCl_4 \cdot 4H2O$, reaction products of $H_2PtCl_4 \cdot 6H2O$ with cyclohexane, and reaction products of chloroplatinic acid and monohydric alcohols (such as Lamoreaux Catalyst); platinum-olefin complexes, such as Karstedt's catalyst, platinum carbonyl cyclovinylmethylsiloxane complex, and platinum cyclovinylmethylsiloxane complex; platinum-alcohol complexes; platinum-alcoholate complexes; platinum-ether complexes; platinum-aldehyde complexes; platinum-ketone complexes, such as platinum bisacetoacetate; platinum carbene complexes, reaction products of platinum tetrachloride with olefins and amines; platinum-vinylsiloxane complexes such as platinum-1,3-divinyl-1,1,3,3-tetramethyldisiloxane complex; bis-(γ-picoline)-platinum dichloride; trimethylenedipyridine-platinum dichloride, dicyclopentadiene-platinum dichloride, cyclooctadiene-platinum dichloride; cyclopentadiene-platinum dichloride; bis(alkynyl)bis(triphenylphosphine)-platinum complex; bis(alkynyl)(cyclooctadiene)-platinum complex; dimethylsulfoxyethyleneplatinum (II) chloride; and combinations thereof. The hydrosilation catalyst is present in the curable aryl siloxane composition in an amount, expressed as a Group VIII element equivalent value, of: at least 0.005, at least 0.01, or at least 0.1 ppm; and no more than 3.0, no more than 2, less than 1, less than 0.6 ppm, or no more than 0.5 ppm, based on the weight of the curable aryl siloxane composition. The hydrosilation catalyst, and any derivatives thereof, are similarly present in the cured aryl polysiloxane composition in a combined amount, expressed as a Group VIII element equivalent value, of: at least 0.005, at least 0.01, or at least 0.1 ppm; and no more than 3.0, no more than 2, less than 1, less than 0.6 ppm, or no more than 0.5 ppm, based on the total weight of the cured aryl polysiloxane composition. Further, a suitable upper limit for the amount of the hydrosilation catalyst and derivatives thereof may even be as low a 0.45 ppm, expressed as a Group VIII element equivalent value. One skilled in the art will recognize that portions or all of a hydrosilation catalyst may be converted to derivatives, including other catalytic species and inactive degradation products, during or after curing. Hence, the amounts of both hydrosilation catalyst and derivatives thereof are expressed as a Group VIII element equivalent value.

Suitable hydrosilation catalysts of the present invention include individual molecules (i.e., small molecules, or individual polymeric chains) in the curable aryl siloxane composition and in the cured aryl polysiloxane composition. Other suitable hydrosilation catalysts include Group VIII metal nanoparticles having an average particle diameter of at least 1 nm, at least 2 nm, or at least 5 nm; and no more than 30 nm, no more than 20 nm, or no more than 10 nm. Suitable hydrosilation catalysts may further be used in a microencapsulated form, wherein microcapsules include ultra fine particle of a thermoplastic resin such as a polyester resin or a silicone resin) containing the hydrosilation catalyst. The hydrosilation catalyst may also be used in the form of a clathrate compound such as cyclodextrin.

The "silicon bonded aryl group" of the present invention includes any group containing at least one aromatic ring, wherein the aromatic ring may be substituted or unsubstituted, provided that the aryl group is either inert to conditions of the hydrosilation reaction during curing and inert to the conditions of the heat aging test, or, if reactive, does not contribute to loss of desirable properties of the cured aryl polysiloxane composition, properties including color development. A non-exhaustive list of silicon bonded aryl groups includes: phenyl; halophenyl groups such as o-chlorophenyl, m-chlorophenyl, p-chlorophenyl, and dichlorophenyl; alkyl phenyl groups having $C_1$-$C_{12}$ alkyl groups such as tolyl, xylyl, and ethyl-substituted phenyl; phenoxyphenyl groups such as o-phenoxyphenyl, m-phenoxyphenyl, and p-phenoxyphenyl; heteroaryl phenyl groups having heteroaryl substituents bonded to the phenyl ring as a monovalent substituent or as a ring-fused variant, such as arylimides; aralkyl groups such as benzyl or phenethyl; fused ring aryls such as naphthyl; and combinations thereof. A suitable silicon bonded aryl group may be selected from phenyl, phenoxyphenyls, naphthyl, or combinations thereof. Further a suitable silicon bonded aryl group may be phenyl.

The aryl alkenyl polysiloxane of the present invention includes at least two silicon bonded alkenyl groups. Silicon bonded alkenyl groups are present in the aryl alkenyl polysiloxane in an amount of at least 0.1, at least 1, or at least 5 mol %; and no more than 60, no more than 30, or no more than 10 mol %, based on the total silicon bonded organic groups of the aryl alkenyl polysiloxane. Silicon bonded aryl groups are present in the aryl alkenyl polysiloxane in an amount of at least 10, at least 30, or at least 40 mol %; and no more than 99.9, no more than 90, no more than 80, or no more than 70 mol %, based on the total silicon bonded organic groups of the aryl alkenyl polysiloxane.

Silicon bonded alkenyl groups include: vinyl; monoethylenically unsaturated $C_3$-$C_{18}$ linear, branched, or cyclic hydrocarbons such as allyl, prop-1-en-1-yl, hex-1-en-1-yl, and hex-5-en-1-yl; vinyl substituted aryl groups such as p-vinylphenyl, and combinations thereof. The suitable silicon bonded alkenyl group may be selected from vinyl, or allyl, and combinations thereof. The suitable alkenyl group may further be vinyl.

In the cured aryl polysiloxane composition of the present invention, a suitable alkylene bridged aryl polysiloxane is represented by the average compositional formula I,

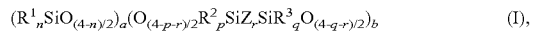

$$(R^1_n SiO_{(4-n)/2})_a (O_{(4-p-r)/2} R^2_p SiZ_r SiR^3_q O_{(4-q-r)/2})_b \qquad (I),$$

wherein:
for each $(R^1_n SiO_{(4-n)/2})$ unit:
  subscript n equals independently 0, 1, 2, or 3;

for each $(O_{(4-p-r)/2} R^2_p SiZ_r SiR^3_q O_{(4-q-r)/2})$ unit:
  subscript p equals 0, 1, 2, or 3;
  subscript q equals 0, 1, 2 or 3;
  p+q=0 to [8-(2r+1)];
  subscript r=1, 2, or 3;
  Z is selected from —CHR$^4$—CHR$^5$—X$_s$—, arylene, substituted arylene, and combinations thereof, wherein:
    —CHR$^4$—CHR$^5$—X$_s$— is the silicon-bridging alkylene moiety
    X is independently selected from methylene, phenyl, substituted phenyl, and combinations thereof;
    subscript s=0 or 1; and
    R$^4$ and R$^5$ are independently selected from hydrogen atom and alkyl;
R$^1$, R$^2$, and R$^3$ are selected from alkenyl, hydrogen atom, aryl, alkyl, hydroxy, alkoxy, aryloxy, other hydrocarbon radical, and combinations thereof;
subscripts a and b are selected to conform with the mole fraction of the $(R^1_n SiO_{(4-n)/2})$ unit and the $(O_{(4-p-r)/2} R^2_p SiZ_r SiR^3_q O_{(4-q-r)/2})$ unit, respectively;
$0 \leq a \leq 1$; $0 \leq b \leq 1$; and
a+b=1.

Subscripts "a" and "b" represent mole fractions. For example, an alkylene bridged aryl polysiloxane having 4 $(R^1_n SiO_{(4-n)/2})$ units and 6 $(O_{(4-p-r)/2} R^2_p SiZ_r SiR^3_q O_{(4-q-r)/2})$ units would have Formula I "a" and "b" values or 0.4 and 0.6, respectively.

In a suitable alkylene bridged polysiloxane of Formula I, the mole percent of the combined R-groups, R$^1$, R$^2$, and R$^3$ of the alkylene bridged aryl polysiloxane of formula IV which are selected from vinyl, hydrogen atom, methyl, phenyl, naphthyl, and phenoxyphenyl is at least 70, at least 90, or at least 95 mole percent; and 100, no more than 99, or no more than 97 mole percent, based on total moles of silicon bonded organic groups of the alkylene bridged aryl polysiloxane.

The silicon-bridging alkylene moiety of the present invention is formed by the hydrosilation of a silicon bonded alkenyl group with a silicon bonded hydrogen atoms (i.e., by hydrosilation). Because silicon bonded alkenyl groups include: vinyl; monoethylenically unsaturated $C_3$-$C_{18}$ linear, branched, or cyclic hydrocarbons, along with vinyl substituted aryl groups, the number of carbon atoms included in the CHR$^4$CHR$^5$ unit of a silicon-bridged alkylene moiety will typically be 2-18 carbon atoms. As such, R$^4$ and R$^5$ may each include 0-16 carbon atoms, with the combined number of carbon atoms of R$^4$ and R$^5$ ranging from 0-16. In fact, while typically there will be 2-18 carbon atoms in the CHR$^4$CHR$^5$ unit, there is no particular limit on the total number of carbon atoms in the CHR$^4$CHR$^5$ unit.

The Mn of the alkylene bridged aryl polysiloxane of the present invention is at least 234, at least 500 g/mole, or at least 1,000 g/mole and no particular upper limit, given that the alkylene bridged aryl polysiloxane can be a single crosslinked molecule having an indeterminately high molecular weight, or multiple crosslinked molecules. Herein, the term "crosslink" means that two reactive silicon bonded organic groups having complementary reactivity (i.e., the ability to react with one another), and present as silicon bonded organic groups on any of the aryl alkylene polysiloxane, the hydrido silicon compound, and the capping agent, have reacted to form a crosslink (e.g., an alkylene bridge is formed by the reaction of a silicon bonded hydrogen atom with a silicon bonded vinyl). The Mn of a suitable alkylene bridged aryl polysiloxane may be at least 234, at least 500 g/mole, or at least 1,000 g/mole; and no more than 300,000, no more than 200,000, no more than 50,000, no more than 10,000 g/mole; and the MWD polydispersity, $M_w/M_n$, may be at least 1.00, at least 1.01, at least 1.1, or at least 1.2; and no more than 50, no more than 20, no more than 10, or no more than 3. One of skill in the art will further recognize, that the alkylene bridged aryl polysiloxane may include a mixture of one or more very large crosslinked molecules (i.e., having an $M_n$ of 200,000, 300,000, 1,000,000, or indeterminately high) with smaller alkylene bridged aryl polysiloxane molecules, such that the MWD is bimodal, or multimodal.

In a suitable curable aryl siloxane composition of the present invention, the aryl alkenyl polysiloxane is represented by the average compositional formula II,

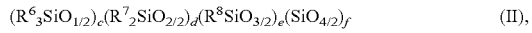  (II), wherein:

$R^6_3SiO_{1/2}$, $R^7_2SiO_{2/2}$, $R^8SiO_{3/2}$, and $SiO_{4/2}$ are, respectively, an M-unit, a D-unit, a T-unit, and a Q-unit, all of which are primary siloxane units;

subscripts c, d, e, and f are selected to conform with the mole fraction of $R^6_3SiO_{1/2}$, $R^7_2SiO_{2/2}$, $R^8SiO_{3/2}$, and $SiO_{4/2}$, respectively;

$0.001 \leq c \leq 1$; $0 \leq d \leq 0.999$; $0 \leq e \leq 0.50$; $0 \leq f \leq 0.10$;

$c+d+e+f=1$;

the silicon bonded alkenyl group is present in the aryl alkenyl polysiloxane in an amount of at least 0.1 mole percent to no more than 60 mole percent, based on total moles of the silicon bonded organic groups of the aryl alkenyl polysiloxane;

the silicon bonded aryl group is present in the aryl alkenyl polysiloxane in an amount of at least 10 mole percent to no more than 99.9 mole percent, based on total moles of the silicon bonded organic groups of the aryl alkenyl polysiloxane; and $R^6$-$R^8$ are selected from alkenyl, hydrogen atom, aryl, alkyl, hydroxy, alkoxy, aryloxy, other hydrocarbon radical, and combinations thereof.

A non-exhaustive list of aryl alkenyl polysiloxanes includes, for example: vinyldimethylsilyl-terminated poly(phenylmethylsiloxane), vinyldimethylsilyl-terminated poly(phenylmethylsiloxane-co-diphenylsiloxane), vinylmethylphenylsilyl-terminated poly(phenylmethylsiloxane), vinylmethylphenylsilyl-terminated poly(phenylmethylsiloxane-co-diphenylsiloxane), vinyldimethylsilyl-terminated poly(phenylmethylsiloxane-co-vinylmethylsiloxane), vinyldimethylsilyl-terminated poly(phenylmethylsiloxane-co-diphenylsiloxane-co-vinylmethylsiloxane), vinylmethylphenylsilyl-terminated poly(phenylmethylsiloxane-co-vinylmethylsiloxane), vinylmethylphenylsilyl-terminated poly(phenylmethylsiloxane-co-diphenylsiloxane-co-vinylmethylsiloxane); divinyldiphenyldimethyldisiloxane, 1,5-divinyl-1,5-dimethyl-tetraphenyltrisiloxane, 1,5-divinyl-hexaphenyltrisiloxane, and combinations thereof.

Silicon bonded hydrogen atoms are present in the hydrido silicon compound of the present invention in an amount of at least 0.1, at least 1, or at least 5 mol %; and no more than 60, no more than 30, or no more than 10 mol %, based on the total silicon bonded organic groups of the hydrido silicon compound. Silicon bonded aryl groups are present in the hydrido silicon compound in an amount of at least 10, at least 30, or at least 40 mol %; and no more than 99.9, no more than 90, no more than 80, or no more than 70 mol %, based on the total silicon bonded organic groups of the hydrido silicon compound.

In a suitable curable aryl siloxane composition of the present invention, the hydrido silicon compound includes a hydrido silicon compound selected from:

i) a hydrido silicon compound having the average compositional formula III,

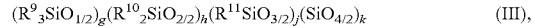  (III), wherein:

$R^9_3SiO_{1/2}$, $R^{10}_2SiO_{2/2}$, $R^{11}SiO_{3/2}$, and $SiO_{4/2}$ are, respectively, an M-unit, a D-unit, a T-unit, and a Q-unit, all of which are primary siloxane units;

subscripts g, h, j, and k are selected to conform with the mole fraction of $R^9_3SiO_{1/2}$, $R^{10}_2SiO_{2/2}$, $R^{11}SiO_{3/2}$, and $SiO_{4/2}$, respectively;

$0.001 \leq g \leq 1$; $0 \leq h \leq 0.999$; $0 \leq j \leq 0.50$; $0 \leq k \leq 0.10$;

$g+h+j+k=1$;

the silicon bonded hydrogen atom is present in the hydrido silicon compound in an amount of at least 0.1 mole percent to no more than 60 mole percent, based on total moles of the silicon bonded organic groups of the hydrido siloxane compound;

the silicon bonded aryl group is present in the hydrido silicon compound in an amount of at least 10 mole percent to no more than 99.9 mole percent, based on total moles of the silicon bonded organic groups of the hydrido siloxane compound; and $R^9$-$R^{11}$ are selected from alkenyl, hydrogen atom, aryl, alkyl, hydroxy, alkoxy, aryloxy, other hydrocarbon radical, and combinations thereof; and ii) a hydrido silicon compound having the formula IV:

  (IV)

wherein:

m=1, or 2; and $R^{12}$ is selected from alkenyl, aryl, alkyl, hydroxy, alkoxy, aryloxy, other hydrocarbon radical, and combinations thereof; and combinations thereof.

There is no particular limit to the $M_n$, the $M_w$, or the MWD polydispersity, $M_w/M_n$, of either the aryl alkenyl polysiloxane or the hydrido silicon compound of the present invention. Further, either may be single, well defined compound having a single molecular weight, or it may be of a collection of polymeric chains having a distribution of chain lengths and, hence, molecular weights. Typically, the $M_n$ for either is at least 100, at least 500 g/mole; and no more than 50,000, no more than 30,000, no more than 10,000, or no more than 2,000 g/mole. Typically, the MWD polydispersity, $M_w/M_n$, for either is at least 1.00, at least 1.01, at least 1.1, or at least 1.2; and no more than 20, no more than 10, or no more than 3.

A non-exhaustive list of hydrido silicon compounds includes, for example: hydride terminated poly(phenyl-(dimethylhydrosiloxy)siloxane), hydride terminated poly(methylhydrosiloxane-co-phenylmethylsiloxane), phenyltris(dimethylsiloxy)silane, phenylsilane, diphenylsilane, 1,3-diphenyl-1,1,3,3-tetrakis(dimethylsiloxy)disiloxane, and combinations thereof.

Any of $R^6$-$R^8$ of formula II may include silicon bonded alkenyl groups, and $R^1$-$R^3$ combined must include at least two silicon bonded alkenyl groups. Any of $R^9$-$R^{11}$ of formula III may include silicon bonded hydrogen atoms, and $R^9$-$R^{10}$ combined must include at least two silicon bonded hydrogen atoms. Any of $R^6$-$R^8$ of formula II, $R^9$-$R^{11}$ of formula III, and $R^{12}$ of formula IV may further include silicon bonded groups selected from: aryl; alkyl; hydroxy; alkoxy, aryloxy; other hydrocarbon radical; and combinations thereof. Still further, one skilled in the art will recognize that it is possible that an aryl alkenyl polysiloxane or a hydrido silicon compound of the present invention may include both a silicon bonded alkenyl and a silicon bonded hydrogen atom such that: any of $R^6$-$R^8$ of formula II may, optionally, include one or more silicon bonded hydrogen atoms ("hydrido groups"); and any of $R^9$-$R^{11}$ of formula III and $R^{12}$ of formula IV may, optionally, include one or more silicon bonded alkenyl groups. A non-exhaustive list of alkyl groups includes: methyl, $C_2$-$C_{12}$ alkyl wherein the alkyl portion is linear, branched or cyclic, such as ethyl, propyl, isopropyl, cyclohexyl, butyl, and isobutyl; halosubstituted alkyls such as 3,3,3-trifluoropropyl; and alkoxysubstituted alkyl such as methoxy methyl. The suitable alkyl group may be selected from methyl or ethyl, and combinations thereof. The suitable alkyl group may be methyl. Alkenyl groups include, for example, vinyl, 1-hexenyl, 5-hexenyl, allyl, 2-hexenyl, and vinyl phenyl (i.e., styrenic groups bound to silicon through a covalent bond with a carbon of the phenyl ring). A suitable alkenyl group may be selected from vinyl or allyl, and combinations thereof. The suitable alkenyl group may be vinyl. Suitable alkenyl groups may include at least one vinyl phenyl group. Because a vinyl phenyl group is both an alkenyl group and an aryl group, it is possible to count it as both an alkenyl group and an aryl group when determining mole percent. In recognition of this apparent conflict, the following formalism is adhered to herein: when a silicon bonded group is both aryl and alkenyl, that silicon bonded group will be counted as an alkenyl group. For example, if an aryl alkenyl polysiloxane includes two silicon bonded vinyl groups, one silicon bonded p-vinylphenyl group, five silicon bonded phenyl groups, and two silicon bonded methyl groups, the mole percent silicon bonded alkenyl groups is calculated under the formalism to be 30 mole percent, based on total moles of silicon bonded organic groups, and the mole percent silicon bonded aryl groups is calculated under the formalism to be 50 mole percent, based on total moles of silicon bonded organic groups. Alkoxy groups include, for example: methoxy, $C_2$-$C_{12}$ alkoxy wherein the alkyl portion is linear, branched or cyclic, such as ethoxy, propoxy, isopropoxy, butoxy, and t-butoxy. A suitable alkoxy group may be selected from methoxy or ethoxy, and combinations thereof. The suitable alkoxy group may be methoxy. Aryloxy groups include, for example: phenoxy; phenoxy having one or more alkoxy, aryloxy, or halo substitutents attached to the phenyl ring. One skilled in the art will recognize that other hydrocarbon radicals beyond the types and specific groups listed supra, may be present in the aryl alkylene polysiloxane, the hydrido silicon compound, and the alkylene-bridged aryl polysiloxane of the present invention. Typically, these other hydrocarbon radicals are present in an amount of 0 mol % to no more than 10 mol %, based on total moles of the silicon bonded organic groups present in the molecule. Even greater than 10 mol % of other hydrocarbon radicals may be present, provided deleterious effects upon curing and heat aging, as determined by the accelerated heat aging test, are minimal or non-existent. A non-exhaustive list of type of other hydrocarbon radicals includes: nitriles; (meth)acrylates, amides, imides, and combinations thereof.

Of the silicon bonded groups other than vinyl which are suitable as $R^6$-$R^8$ of formula II, one skilled in the art will recognize that certain of those groups may be more stable than others to conditions of the accelerated heat aging test if incorporated into the aryl alkylene polysiloxane of the present invention. Further, of the silicon bonded groups, other than hydrogen atom, which are suitable as $R^9$-$R^{11}$ of formula III, one skilled in the art will recognize that certain of those groups may be more stable than others to conditions of the accelerated heat aging test if incorporated into the hydrido silicon compound of the present invention. Therefore, the mole percent of the combined R-groups, $R^6$-$R^8$, of a suitable aryl alkylene polysiloxane of formula I which are selected from vinyl, hydrogen atom, methyl, phenyl, naphthyl, and phenoxyphenyl may be at least 70, at least 90, or at least 95 mole percent; and 100, no more than 99, or no more than 97 mole percent, based on total moles of silicon bonded organic groups of the aryl alkylene polysiloxane. Similarly, the mole percent of the combined R-groups, $R^9$-$R^{11}$, of a suitable hydrido silicon compound of formula III, which are selected from vinyl, hydrogen atom, methyl, phenyl, naphthyl, and phenoxyphenyl may be at least 70, at least 90, or at least 95 mole percent; and 100, no more than 99, or no more than 97 mole percent, based on total moles of silicon bonded organic groups of the hydrido silicon compound.

In the curable aryl siloxane composition of the present invention, the mole ratio of silicon bonded hydrogen atoms of the hydrido silicon compound to silicon bonded alkenyl groups of the aryl alkenyl polysiloxane is at least 0.5, at least 0.8, or at least 1.0; and no more than 3.0, no more than 2.0, or no more than 1.5.

One skilled in the art will further recognize that other compounds may be incorporated into the aryl alkenyl polysiloxane, the hydrido silicon compound, or directly into the alkylene bridged aryl polysiloxane of the present invention. For example, silicon compounds having two silicon atoms joined by a spacer which is an arylene such as 1,4-phenylene, 1,4'-biphenylene, or a substituted arylene, may be incorporated into the alkylene bridged polysiloxane. For example, the silphenylene monomer unit, 1,4-HOSiMe$_2$-Ph-SiMe$_2$OH, may be incorporated, ultimately introducing a —O—SiMe$_2$-Ph-SiMe$_2$-O—, unit to the structure of the alkylene bridged aryl polysiloxane.

The capping agent of the present invention includes capping agents selected from: "alkenyl capping agent"; "hydride capping agent"; "alkoxy capping agent", "aralkoxy" or "hydroxy capping agent". An alkenyl capping agent includes an "alkenyl capping moiety" which is a moiety capable of reacting with a silicon bonded vinyl group. Typically, an alkenyl capping moiety is a "hydrido silicon bond" (i.e., an Si—H bond). Illustrative examples of alkenyl capping agents include: trimethyl silane, triphenyl silane, methyl phenyl silanes, and pentaphenyl disiloxane. A hydride capping agent includes a "hydride capping moiety" which is a moiety capable of reacting with a silicon bonded hydride group. Typically, a hydride capping moiety is an alkenyl group. Illustrative examples of a hydride capping agent include: trimethyl vinyl silane, triphenyl vinyl silane, and pentaphenyl vinyl disiloxane. An alkoxy capping agent includes an alkoxy capping moiety which is a moiety capable of reacting with a silicon bonded alkoxy group. Typically, an alkoxy capping moiety is selected from alkoxy, water, or hydroxy, and combinations thereof. Illustrative examples of alkoxy capping agents include: trimethyl methoxy silane, triphenyl methoxy silane, triphenyl ethoxy silane, and pentaphenyl methoxy disiloxane. A hydroxy capping agent includes a "hydroxy capping moiety" which is a moiety capable of reacting with a silicon bonded hydroxyl group. Typically a hydroxy capping moiety is selected from alkoxy or hydroxy, and combinations thereof. Illustrative examples of hydroxy capping agents include: trimethyl methoxy silane, triphenyl methoxy silane, triphenyl ethoxy silane, and pentaphenyl methoxy disiloxane. One of skill in the art will further recognize that the capping agent of the present invention may include capping moieties other than those explicitly indicated supra, provided those other capping agents include capping moieties reactive with silicon bonded alkenyl, hydride, alkoxy, aralkoxy, or hydroxyl groups without adversely affecting the curing reaction or the cured aryl polysiloxane composition.

The cured aryl polysiloxane composition of the present invention may further include an additive. One or more additives may be included in the cured polysiloxane provided that the presence of the additive or combination of additives does not degrade the essential property of non-yellowing during the accelerated heat aging test. A non-exhaustive list of additives includes: nanoparticle or microparticle sized fillers such as ceria, titania, silica, zirconia, hafnium oxide, vanadium oxide, lanthanum oxide; anti-oxidants; hindered amine light stabilizers (HALS); lubricity additives; fungicides; flame retardants; contrast enhancers; UV-stabilizers; photostabilizers; surfactants; adhesive modifiers such as alkoxy-containing silanes, alkoxy-containing silicones, and epoxy silicones); phosphors; absorbing dyes; fluorescent dyes; electrical or thermal conductivity additives such as carbon nanotubes or nanoparticles; chelation or sequestration agents acid scavengers; base scavengers; and metal passivators and fortifiers such as fluorescing powders, nanotubes, nanospheres, nanoparticles, microspheres, pigments, liquid crystals, and clays. An additive can be included in the cured aryl polysiloxane composition so long as the essential property of non-yellowing upon 200° C. heat treatment remains.

High RI nanoparticles or other additives may be added to the composition to raise the refractive index of the composite. Such refractive index raising additives include, for example, ceria, titania, zirconia, hafnium oxide, vanadium oxide, lanthanum oxide, zinc oxide, tungstates, molybdates, niobium oxide, indium oxide, indium tin oxide, hexaphenyldisiloxane, tetraphenyllead, and tetraphenylsilane. The plural high RI nanoparticles of the present invention have an average particle diameter of at least 1 nm, at least 2 nm, or at least 5 nm; and no more than 30 nm, no more than 20 nm, or no more than 10 nm. When the application for the cured aryl polysiloxane composition requires high light transmission, it is a further requirement that the plural high RI nanoparticles not significantly diminish that light transmission of the specimen to a value below 90%. There is no particular limit to the PSD polydispersity for the plural high RI nanoparticles, however, the PSD polydispersity for the plural high RI nanoparticles is typically at least 1.00, at least 1.01, at least 1.1, or at least 1.2; and no more than 20, no more than 10, or no more than 3. The PSD may be unimodal or multimodal.

Furthermore, cure inhibitors, auxiliary catalysts, adhesion promoters, surface passivation agents, and passivation agents for mobile ionic species can be included in the curable aryl siloxane composition and in the cured aryl polysiloxane composition of the present invention provided the essential property of non-yellowing during the accelerated heat aging test is retained. Cure inhibitors include, for example: acetylene alcohols such as 3-methyl-3-butyn-2-ol, 2-methyl-1-pentyn-3-ol, 3,5-dimethyl-1-hexyn-3-ol, 2,5-dimethyl-3-hexyn-2,5-diol, 3,6-dimethyl-4-octyne-3,6-diol, 2,4,7,9-tetramethyl-5-decyne-4,7-diol, and 3,7-dimethyl-6-octen-1-yn-3-ol ("dehydrolinalool" from BASF); triazoles; hydrosilanes such as 1,3-divinyl-1,1,3,3-tetramethyldisiloxane; dialkylformamides; alkylthioureas; methyl ethyl ketoxime; organosilicon compounds with aliphatic triple bonds and suitable boiling points; maleic monoesters; mixtures of diallyl maleate and vinyl acetate; nitrile compounds; and phosphorous compounds. Auxiliary catalysts include, for example metal oxides such as oxides of titanium, tin, zirconium, and lead. These same metal oxides may further be capable of acting as adhesion promoters. Passivation agents, typically preventing interaction with water by lowering surface energy, include, for example, poly[(3,3,3-trifluoropropyl)methylsiloxane], (3,3,3-trifluoropropyl)trimethoxysilane, (heptadecafluoro-1,1,2,2-tetrahydrodecyl)triethoxysilane, (tridecafluoro-1,1,2,2,-tetrahydrooctyl)trimethoxysilane, (tridecafluoro-1,1,2,2-tetrahydrooctyl)dimethylchlorosilane, and 3,5-bis(trifluoromethyl)phenyldimethylchlorosilane.

A carrier solvent may also be applied in order to form high temperature resistant silicone coatings. A non-exhaustive list of suitable solvents includes toluene, xylenes, acetone, ether-based solvents (dowanols, glymes, alkyl ethers), and halogenated solvents. All solvents that are miscible with the curable aryl siloxane composition of the present invention or the cured aryl polysiloxane composition of the present invention can be included in those compositions provided the essential property of non-yellowing during the accelerated heat aging test is retained.

The method of making the cured aryl polysiloxane composition of the present invention, includes the steps of: combining an aryl alkenyl polysiloxane with a hydrido silicon compound, a hydrosilation catalyst, and, optionally, a capping agent to produce a curable aryl siloxane composition; and curing the curable aryl siloxane composition to form the cured aryl polysiloxane composition. One of skill in the art will recognize that curing temperatures and times may be varied to accommodate specific curable aryl siloxane compositions and hydrosilation catalyst levels. Typically, the curing temperature is selected such that a cured aryl polysiloxane composition is formed within a few minutes to several hours, and can be at least 100, at least 120, or at 140° C.; and no more than 220, no more than 200, or no more than 180° C. Suitable methods of making the cured aryl polysiloxane composition may further include curing temperatures above and below the extrema of just stated. Curing temperatures below 100° C. may be desirable for particularly reactive systems or for sensitive electronic devices, while curing temperatures above 220° C. may be desirable for particularly unreactive systems that are also particularly stable to high temperatures during and after curing. Of course, characteristics of each curable aryl siloxane composition such as the volatility of components must also be considered when selecting curing conditions. It is further understood that the curing temperature may be varied during curing. For example, the curing temperature might be set initially to be 130° C., but programmed to rise to 150° C. during 2 hours, followed by an 8 hour final curing time interval at 180° C. Typically, the aryl alkenyl polysiloxane and the hydrosilation catalyst will be combined prior to addition of the hydrido silicon compound to assure uniform distribution of the hydrosilation catalyst prior to its interaction with silicon bonded hydrogen atoms. Such interaction in the absence of readily accessible aryl alkenyl polysiloxane can lead to precipitation of products of that interaction, rendering difficult, or impossible, formation of a uniform, fully curable reaction mixture upon subsequent addition of aryl alkenyl polysiloxane. It is further possible to combine the hydrosilation catalyst with mixtures containing both the aryl alkenyl polysiloxane and the hydrido silicon compound.

The cured aryl polysiloxane composition can, of course, be formed in absence of any device using the method of curing of the present invention by, for example: formation and curing of films; extrusion, or exudation of variously shaped articles; injection molding, and other mold based formation, of various shaped articles, (e.g., lenses, or films having patterned surfaces, such as light extraction films). When a device, such as a semiconductor device, is present during curing, it is necessary that a curing temperature be selected that does not damage the device. In such case, one or more semiconductor elements of the semiconductor device may be encapsulated to form an encapsulated semiconductor device by coating the semiconductor element with the curable aryl alkylene polysiloxane composition before or during the step of curing. Alternatively, the cured aryl polysiloxane composition may be formed as, for example, a free-standing film and then applied to the device.

The heat stable cured aryl polysiloxane composition of the present invention has many uses, including underfiller, protective coating agent, potting agent, or adhesive agent for electric and electronic products, including semiconductors. There is no particular limit to the types of semiconductor that can be encapsulated. For example, light emitting diode (LED) devices can be encapsulated with the cured aryl polysiloxane of the present invention. The high light transmittance of the aryl polysiloxane composition makes it particularly suitable for use as an underfiller, protective coating agent, potting agent, or adhesive agent in semiconductor elements used for optical applications.

The device of the present invention is characterized in that its semiconductor elements are coated with cured aryl polysiloxane composition, or are coated with the curable aryl siloxane composition, and then cured in place. Such semiconductor elements are exemplified by semiconductor elements used in diodes, transistors, thyristors, solid-state image pickup elements, monolithic ICs and in hybrid ICs. In addition, such semiconductor devices are exemplified by diodes, light-emitting diodes (LEDs), transistors, thyristors, photocouplers, charge coupled devices (CCDs), monolithic integrated circuits (ICs), hybrid ICs, large and very large scale integrated circuits (LSIs, and VLSIs).

EXPERIMENTAL

Some embodiments of the invention will now be described in detail in the following Examples.

Molecular Weight Determination using Gel Permeation Chromatography (GPC). Gel Permeation Chromatography, otherwise known as size exclusion chromatography, actually separates the members of a distribution according to their hydrodynamic size in solution rather than their molar mass. The system is then calibrated with standards of known molecular weight and composition to correlate elution time with molecular weight. The techniques of GPC are discussed in detail in *Modern Size Exclusion Chromatography*, W. W. Yau, J. J Kirkland, D. D. Bly; Wiley-Interscience, 1979, and in *A Guide to Materials Characterization and Chemical Analysis*, J. P. Sibilia; VCH, 1988, p. 81-84.

For example, the molecular weight information for a low molecular weight sample (e.g., 10,000) may be determined as follows: The sample (an aqueous emulsion containing low molecular weight particles) is dissolved in THF at a concentration of approximately 0.1% weight sample per volume THF, and shaken for 6 hours, followed by filtration through a 0.45 μm PTFE (polytetrafluoroethylene) membrane filter. The analysis is performed by injecting 100 μl of the above solution onto 3 columns, connected in sequence and held at 40° C. The three columns are: one each of PL Gel 5 100, PL Gel 5 1,000, and PL Gel 5 10,000, all available from Polymer Labs, Amherst, Mass. The mobile phase used is THF flowing at 1 ml/min. Detection is via differential refractive index. The system was calibrated with narrow molecular weight polystyrene standards. Polystyrene-equivalent molecular weights for the sample are calculated via Mark-Houwink correction using $K=14.1\times10^{-3}$ ml/g and $a=0.70$ for the polystyrene standards.

Nuclear magnetic resonance (NMR) method for determining ratio of silicon bonded vinyl groups to silicon bonded hydrogen atoms. NMR analysis, using a Bruker ADVANCE™ 500 NMR Spectrometer, provided the gram equivalent weights of silicon bonded hydrogen atoms and vinyl components for formulating. The integrated proton NMR signal of vinylic or hydridic protons a silicon containing compound was compared to the integrated signals from a known quantity of a toluene standard by proton NMR. The quantity of vinyl or hydride protons could then be calculated on a weight basis. For example, in the case of vinyl group determination, the combined proton signal from the three vinylic protons was compared against the three protons of the methyl group of toluene. A calculated amount (weight) of aryl vinyl polysiloxanes was removed from a given stock solution of an aryl vinyl polysiloxane and combined with a hydrosilation catalyst. A calculated amount of hydrido silicon compound was added either volumetrically (with known densities) or by weight.

X-ray fluorescence (XRF) method for determining platinum concentration in hydrosilation catalyst stock solutions. Hydrosilation catalyst stock solutions were prepared by dissolving a known amount of hydrosilation catalyst in a known amount of solvent (toluene or xylenes). Platinum concentrations were calculated by performing X-ray fluorescence (XRF) spectroscopy on hydrosilation catalyst stock solutions in toluene or xylenes. XRF measurements, using a Philips PW2404 Sequential Wavelength Dispersive XRF, were calibrated with known platinum standards. Calculated amounts (e.g., microliters delivered using a micropipette) of hydrosilation catalyst stock solution were combined first with an aryl vinyl polysiloxane and then with a hydrido silicon compound to form a curable aryl siloxane composition. Hydrosilation catalyst stock solutions were prepared at multiple concentrations.

Heat aging of cured aryl polysiloxane compositions. The accelerated heat aging test, using a Fisher IsoTemp™ Furnace, was performed in air at a 200° C., during various time periods. The stringent conditions for the accelerated heat aging test were selected to provide an indication of the behavior in service to be anticipated for the various cured aryl polysiloxane compositions, which need to remain clear and color free over long service lives at lower temperatures (e.g., 150-180° C.). Not all formulations aged well—some formulations cracked, shrank, exhibited wrinkled surfaces, or delaminated from the glass slides or microbeakers. Not all formulations have optimal mechanical properties, but they are included to show the breadth of the ability of the present invention to prevent color formation.

UV-visible (UV-vis) spectroscopic analysis of cured aryl polysiloxane compositions after aging. Heat aged films having a thickness of approximately 0.6 mm were analyzed for color and optical clarity using a Hewlett-Packard Model 8453 spectrophotometer. UV-visible data were corrected for sample differences by subtracting a straight baseline from the data which was determined by the 0 day measurement on each sample.

CIE (Commission Internationale de l clairage) analysis of cured aryl polysiloxane compositions after aging. Films having a thickness of approximately 0.6 mm were analyzed for color and clarity using an X-Rite 500 Series Spectrodensitometer. No corrections were made for the thickness of films in CIE measurements, but, for a given formulation series, all samples were within 20% of each other in terms of thickness. The CIE measurement space was the CIE 1976 L*a*b* space, using a $D_{65}/10$ setting (i.e., 65 degree illumination angle; 10 degree observer angle), and color measurements were made by placing the samples over a calibrated white dot. A specimen heat aged for 14 days at 200° C. in air which, upon observation using this CIE 1976 L*a*b* space $D_{65}$(illumination angle)/10(observation angle) color test method, has passed the "accelerated heat aging test" if the CIE b value is equal to or less than 2.0.

Materials. Most siloxane monomers and polymers were purchased from Gelest, Inc. Solvents and other chemicals were purchased from Aldrich or Fisher Scientific. Chemicals were used as received. Quartz slides or wafers were used for UV-vis of siloxane samples, and these were purchased from GM Associates, Inc. Platinum catalysts were purchased from Gelest. In the case of Karstedt's Catalyst (platinum-divinyltetramethyldisiloxane complex in xylene), the low color version available from Gelest was utilized for all experiments. The platinum concentration was calculated by doing x-ray fluorescence spectroscopy on the platinum stock solutions. In the examples, vinyl polymer #2 (Vinyl #2 in the tables) was purchased from Aldrich (482048). Vinyl polymer #3 (PMV-9925) and hydrides #1 (HPM-502), #2 (SIP6826), #4 (H-11), #5 (SIP6736.5), and #6 (SID4582) were purchased from Gelest. Polymer molecular weights were determined by gel-permeation chromatography using polystyrene standards, and are therefore relative molecular weights.

Example 1

Synthesis of Vinyl #1. Preparation of a trimethyl silicon capped aryl vinyl polysiloxane having phenyl and methyl groups attached to silicon Vinyltrimethoxysilane (76.24 grams), 370.96 g dimethyldimethoxysilane, 11.6 g of 0.02 N HCl, and 136.92 g of water were added to a 3-neck flask. The pot temperature was ramped from 67 to 130° C., and distillate was removed over the course of 4 hours. The reaction mixture was cooled to room temperature, and 120.91 g of trimethylmethoxysilane was added, along with an additional 11.6 g of 0.02 N HCl. The reaction was stirred at 60° C. for 3 hrs, and then distillate was removed up to 85° C. In order to fully cap the polymer, 72.86 g of dry triethylamine were added, followed by a slow addition of 78.22 g of trimethylchlorosilane. The reaction was diluted with 300 mL of hexane, and washed with 10% HCl until the pH of the organic fell below 7. The organic (hexane) phase was then washed with water until the pH was 5-6. The organic phase was then stripped under vacuum at a temperature of 80° C. The yield was 190 grams of liquid aryl vinyl polysiloxane.

Example 2

Synthesis of Vinyl #4. Preparation of a diphenylmethyl silicon capped aryl vinyl polysiloxane having phenyl and methyl groups attached to silicon, and including polymerized a silphenylene monomer unit. 1,4-Bis(hydroxydimethylsilyl) benzene (4.08 grams), 2.73 g of phenylmethyldimethoxysilane, 2.38 g of methylvinyldimethoxysilane, 2.18 g of diphenylmethylethoxysilane, 4.32 g of water, and 28 mg of potassium hydroxide were combined in a round-bottom flask. The reaction mixture was refluxed briefly, and the methanol was removed at a pot temperature of 100-110° C. (120° C. oil bath) over the course of 1.5 hours. After the methanol and some water was removed, the reaction mixture was cooled and diluted with toluene. The toluene solution was extracted twice with ammonium chloride solution and once with deionized water, so that the pH was neutral. The organic phase was filtered, dried over magnesium sulfate, and concentrated on a rotary evaporator. The yield was 8.09 g of liquid aryl vinyl polysiloxane.

Example 3

Synthesis of Vinyl #5. Preparation of a trimethylethoxysilicon capped aryl vinyl polysiloxane having phenyl and methyl groups attached to silicon. Diphenyldimethoxysilane (8.06 grams), 6.38 g of phenylmethyldimethoxysilane, 2.37 g of vinyltrimethoxysilane, 1.89 g of trimethylethoxysilane, 9 g of water, and 105 mg of potassium hydroxide were combined in a round-bottom flask. The reaction was stirred at 75° C. for 16 hrs. The methanol was then removed at a pot temperature of 100-110° C. (120° C. oil bath). After the methanol and some water was removed, 3.80 g of trimethylethoxysilane was added to ensure capping, and the mixture was stirred for 40 minutes at 80° C. The reaction was cooled and diluted with toluene. It was extracted twice with ammonium chloride solution and once with deionized water, so that the pH was neutral. The organic phase was filtered, dried over magnesium sulfate, and concentrated on a rotary evaporator. The yield was 9.98 g of liquid aryl vinyl polysiloxane.

Example 4

Synthesis of Hydride #3. Preparation of a hydrido silicon compound having phenyl and methyl groups attached to silicon. Diphenyldimethoxysilane (19.55 grams), 6.01 g of pentamethylcyclopentasiloxane, 2 g of sulfuric acid, and 4 g of water were added to a flask and stirred at room temperature overnight. The reaction was worked up by the addition of 150 mL of toluene. The organic phase was extracted 2 times with saturated aqueous sodium bicarbonate (300 mL each), and 2 times with water (300 mL each). The organic phase was stripped on a rotary evaporator, yielding 18 g of a viscous clear polymer.

Example 5

Preparation and curing of a curable aryl siloxane composition. To the aryl vinyl polysiloxane was added an amount of hydrosilation catalyst (platinum catalyst) dissolved in toluene or xylenes, and the components were mixed thoroughly on a roller mixer. For viscous vinyl silicones, hexane was used as a diluent to aid in weighing and mixing the polymers with the platinum catalysts. In these cases, the hexane was removed by evaporation on a hot plate prior to addition of the hydrido silicon compound. The hydrido silicon compound was added and mixed thoroughly on a roller mixer. The formulation was then poured onto a quartz slide (specimen for UV-vis measurements), or glass slide (specimen for CIE measurements), or into a glass microbeaker (specimen for visual measurements). NMR analysis provided the gram equivalent weights of hydride and vinyl components for formulating. Initial cure temperatures and time periods were in the ranges 100-130° C. and 1-4 hours, respectively, with higher temperatures and longer times chosen for curable aryl siloxane compositions having slower curing characteristics. Samples having Pt levels of greater than 0.2 ppm were cured on thermostated hot plates at 100-130° C. during time periods of up to 2.0 hours. Certain low catalyst level formulations (Pt levels below 0.2 ppm) required initial curing at elevated temperatures of 160-180° C. for 0.5-4 hrs. All initially cured samples were then subjected to a final curing step during 8 hrs at 130° C.

TABLE A

Amounts of reactants and catalysts used in example formulations.

| Sample | Vinyl polysiloxane ID[a] | Wt.[b] (g) | Hydrido silicon compound ID[a] | Wt.[b] (g) | Equiv.[c] Si—H | Hydrosilation catalyst | 1X Pt Soln. to add (μL)[d] | Pt (ppm) |
|---|---|---|---|---|---|---|---|---|
| C1 | Vinyl 1 | 0.5 | Hydride 4 | 0.611 | 1.05 | HSC-1 | 0.478 | 9.91 |
| C2 | Vinyl 1 | 0.5 | Hydride 4 | 0.611 | 1.05 | HSC-1 | 0.245 | 5.07 |
| C3 | Vinyl 1 | 0.5 | Hydride 4 | 0.611 | 1.05 | HSC-1 | 0.050 | 1.04 |
| C4 | Vinyl 1 | 0.5 | Hydride 4 | 0.611 | 1.05 | HSC-1 | 0.022 | 0.46 |
| C5 | Vinyl 2 | 0.5 | Hydride 2 | 0.026 | 2 | HSC-1 | 0.226 | 9.91 |
| C6 | Vinyl 2 | 0.5 | Hydride 2 | 0.026 | 2 | HSC-1 | 0.116 | 5.07 |
| 1 | Vinyl 2 | 0.5 | Hydride 2 | 0.026 | 2 | HSC-1 | 0.024 | 1.04 |
| 2 | Vinyl 2 | 0.5 | Hydride 2 | 0.026 | 2 | HSC-1 | 0.011 | 0.46 |
| C7 | Vinyl 3 | 0.5 | Hydride 2 | 0.045 | 2 | HSC-1 | 0.234 | 9.91 |
| C8 | Vinyl 3 | 0.5 | Hydride 2 | 0.045 | 2 | HSC-1 | 0.120 | 5.07 |
| 3 | Vinyl 3 | 0.5 | Hydride 2 | 0.045 | 2 | HSC-1 | 0.060 | 2.54 |
| 4 | Vinyl 3 | 0.5 | Hydride 2 | 0.045 | 2 | HSC-1 | 0.025 | 1.04 |
| 5 | Vinyl 3 | 0.5 | Hydride 2 | 0.045 | 2 | HSC-1 | 0.011 | 0.46 |
| 6 | Vinyl 3 | 0.5 | Hydride 2 | 0.045 | 2 | HSC-1 | 0.0054 | 0.23 |
| 7 | Vinyl 3 | 0.5 | Hydride 2 | 0.045 | 2 | HSC-1 | 0.0027 | 0.12 |
| 8 | Vinyl 3 | 0.5 | Hydride 2 | 0.045 | 2 | HSC-1 | 0.0011 | 0.05 |
| C9 | Vinyl 3 | 0.5 | Hydride 1 | 0.079 | 2 | HSC-1 | 0.249 | 9.91 |
| C10 | Vinyl 3 | 0.5 | Hydride 1 | 0.079 | 2 | HSC-1 | 0.127 | 5.07 |
| 9 | Vinyl 3 | 0.5 | Hydride 1 | 0.079 | 2 | HSC-1 | 0.064 | 2.54 |
| 10 | Vinyl 3 | 0.5 | Hydride 1 | 0.079 | 2 | HSC-1 | 0.026 | 1.04 |
| 11 | Vinyl 3 | 0.5 | Hydride 1 | 0.079 | 2 | HSC-1 | 0.012 | 0.46 |
| 12 | Vinyl 3 | 0.5 | Hydride 1 | 0.079 | 2 | HSC-1 | 0.0058 | 0.23 |
| C11 | Vinyl 3 | 0.5 | Hydride 5 | 0.062 | 2 | HSC-1 | 0.242 | 9.91 |
| C12 | Vinyl 3 | 0.5 | Hydride 5 | 0.062 | 2 | HSC-1 | 0.124 | 5.07 |
| 13 | Vinyl 3 | 0.5 | Hydride 5 | 0.062 | 2 | HSC-1 | 0.062 | 2.54 |
| 14 | Vinyl 3 | 0.5 | Hydride 5 | 0.062 | 2 | HSC-1 | 0.025 | 1.04 |
| 15 | Vinyl 3 | 0.5 | Hydride 5 | 0.062 | 2 | HSC-1 | 0.011 | 0.46 |
| 16 | Vinyl 3 | 0.5 | Hydride 5 | 0.062 | 2 | HSC-1 | 0.0056 | 0.23 |
| C13 | Vinyl 3 | 0.5 | Hydride 2 | 0.045 | 2 | HSC-2 | 0.234 | 8.50 |
| C14 | Vinyl 3 | 0.5 | Hydride 2 | 0.045 | 2 | HSC-2 | 0.120 | 4.35 |
| 17 | Vinyl 3 | 0.5 | Hydride 2 | 0.045 | 2 | HSC-2 | 0.060 | 2.20 |
| 18 | Vinyl 3 | 0.5 | Hydride 2 | 0.045 | 2 | HSC-2 | 0.025 | 0.89 |
| 19 | Vinyl 3 | 0.5 | Hydride 2 | 0.045 | 2 | HSC-2 | 0.011 | 0.40 |
| C15 | Vinyl 3 | 0.5 | Hydride 2 | 0.045 | 2 | HSC-3 | 0.234 | 8.30 |
| C16 | Vinyl 3 | 0.5 | Hydride 2 | 0.045 | 2 | HSC-3 | 0.120 | 4.25 |
| 20 | Vinyl 3 | 0.5 | Hydride 2 | 0.045 | 2 | HSC-3 | 0.060 | 2.12 |
| 21 | Vinyl 3 | 0.5 | Hydride 2 | 0.045 | 2 | HSC-3 | 0.025 | 0.87 |
| 22 | Vinyl 3 | 0.5 | Hydride 2 | 0.045 | 2 | HSC-3 | 0.011 | 0.39 |
| 23 | Vinyl 3 | 0.5 | Hydride 2 | 0.022 | 1 | HSC-1 | 0.011 | 0.46 |
| 24 | Vinyl 3 | 0.5 | Hydride 2 | 0.034 | 1.5 | HSC-1 | 0.011 | 0.46 |
| 25 | Vinyl 3 | 0.5 | Hydride 2 | 0.045 | 2 | HSC-1 | 0.011 | 0.46 |
| 26 | Vinyl 3 | 0.5 | Hydride 2 | 0.056 | 2.5 | HSC-1 | 0.011 | 0.46 |
| 27 | Vinyl 3 | 0.5 | Hydride 2 | 0.067 | 3 | HSC-1 | 0.011 | 0.46 |
| 28 | Vinyl 3 | 0.5 | Hydride 2 | 0.022 | 1 | HSC-1 | 0.042 | 1.84 |
| 29 | Vinyl 3 | 0.5 | Hydride 2 | 0.034 | 1.5 | HSC-1 | 0.043 | 1.84 |
| 30 | Vinyl 3 | 0.5 | Hydride 2 | 0.045 | 2 | HSC-1 | 0.044 | 1.84 |
| 31 | Vinyl 3 | 0.5 | Hydride 2 | 0.056 | 2.5 | HSC-1 | 0.045 | 1.84 |
| 32 | Vinyl 3 | 0.5 | Hydride 2 | 0.067 | 3 | HSC-1 | 0.045 | 1.84 |
| C17 | Vinyl 3 | 0.7 | Hydride 3 | 0.132 | 2 | HSC-1 | 0.361 | 10.00 |
| C18 | Vinyl 3 | 0.7 | Hydride 3 | 0.132 | 2 | HSC-1 | 0.180 | 5.00 |
| 33 | Vinyl 3 | 0.7 | Hydride 3 | 0.132 | 2 | HSC-1 | 0.036 | 1.00 |
| 34 | Vinyl 3 | 0.7 | Hydride 3 | 0.132 | 2 | HSC-1 | 0.018 | 0.50 |
| 35 | Vinyl 3 | 0.7 | Hydride 3 | 0.132 | 2 | HSC-1 | 0.0089 | 0.25 |
| 36 | Vinyl 3 | 0.7 | Hydride 3 | 0.132 | 2 | HSC-1 | 0.0037 | 0.10 |
| 37 | Vinyl 3 | 0.7 | Hydride 3 | 0.132 | 2 | HSC-1 | 0.0019 | 0.05 |
| 38 | Vinyl 3 | 0.7 | Hydride 3 | 0.132 | 2 | HSC-1 | 0.0004 | 0.01 |
| 39 | Vinyl 3 | 0.7 | Hydride 3 | 0.132 | 2 | HSC-1 | 0.0002 | 0.005 |
| C21 | Vinyl 4 | 0.32 | Hydride 2 | 0.080 | 1.2 | HSC-1 | 0.35 | 20.2 |
| 40 | Vinyl 4 | 0.331 | Hydride 2 | 0.069 | 1 | HSC-1 | 0.080 | 4.6 |
| C22 | Vinyl 5 | 0.4 | Hydride 6 | 0.100 | 1.7 | HSC-1 | 0.40 | 18.4 |
| 41 | Vinyl 5 | 0.34 | Hydride 6 | 0.060 | 1.2 | HSC-1 | 0.32 | 18.4 |
| 42 | Vinyl 5 | 0.34 | Hydride 6 | 0.060 | 1.2 | HSC-1 | 0.32 | 18.4 |

TABLE A-continued

Amounts of reactants and catalysts used in example formulations.

| | Vinyl polysiloxane | | Hydrido silicon compound | | | | 1X Pt | |
|---|---|---|---|---|---|---|---|---|
| Sample | ID[a] | Wt.[b] (g) | ID[a] | Wt.[b] (g) | Equiv.[c] Si—H | Hydrosilation catalyst | Soln. to add (μL)[d] | Pt (ppm) |
| 43 | Vinyl 5 | 0.34 | Hydride 6 | 0.060 | 1.2 | HSC-1 | 0.32 | 18.4 |
| 44 | Vinyl 5 | 0.34 | Hydride 6 | 0.060 | 1.2 | HSC-1 | 0.32 | 18.4 |

[a]ID = identifier.

[b]Wt. = weight.

[c]Equivalents of Si—H per equivalent of Si-vinyl.

[d]1X means the solution is undiluted, while 1/10X, 1/100X, and 1/1000X mean that the 1X solution has been diluted ten-fold, 100-fold, and 1,000-fold, respectively.

HSC-1: Pt concentration in 1X solution = 23,050 ppm;

HSC-2: Pt concentration in 1X solution = 19,777 ppm; and

HSC-3: Pt concentration in 1X solution = 19,300 ppm.

Pt catalysts were added by micropipettor from 1X, 1/10X, 1/100X, and 1/1000X stock solutions.

TABLE 1

Vinyl polysiloxanes and hydrido silicon compounds used in the Experimental Examples.

| | | | | Phenyl[c] | | Methyl[c] | | | |
|---|---|---|---|---|---|---|---|---|---|
| | ID[a] | RI[b] | Mn | Mol % | Wt % | Mol % | Wt % | Mol % | Wt % |
| Vinyl Polysiloxanes | | | | | | | | Vinyl[c] | |
| poly(dimethylsiloxane-co-vinylsiloxane), trimethylsilyl terminated | Vinyl 1 | 1.41 | 3,621 | 0 | 0 | 93 | 86 | 7 | 14 |
| poly(dimethylsiloxane-co-diphenylsiloxane), vinyldimethylsilyl terminated | Vinyl 2 | 1.46 | 9,300 | 16 | 34 | 84 | 66 | <1 | <1 |
| poly(phenylmethylsiloxane), vinyldimethylsilyl terminated | Vinyl 3 | 1.53 | 3,360 | 45 | 72 | 52 | 26 | 3 | 2 |
| poly(phenylmethlsiloxane-co-vinylmethylsiloxane-co-1,4-(bisdimethylsilyl)benzenecarbosiloxane), diphenylmethylsilyl terminated | Vinyl 4 | 1.55 | 1,260 | 28 | | 62 | | 10 | |
| poly(diphenylsiloxane-co-vinylsiloxane-co-phenylmethylsiloxane), trimethylsilyl terminated | Vinyl 5 | 1.56 | 1,470 | 50 | | 42 | | 8 | |
| Hydrido Silicon Compounds | | | | | | | | Hydrogen[c] | |
| poly(methylhydrosiloxane-co-phenylmethylsiloxane), hydrodimethylsilyl terminated | Hydride 1 | 1.50 | 3,480 | 26 | 52 | 50 | 37 | 24 | 11 |
| phenyltris(dimethylsiloxy)silane | Hydride 2 | 1.44 | 330[d] | 10 | 39 | 60 | 49 | 30 | 12 |
| poly(methylhydrosiloxane-co-diphenylsiloxane) | Hydride 3 | 1.56 | 6,200 | 44 | 72 | 28 | 17 | 28 | 11 |
| Poly(dimethylsiloxane), hydrodimethylsilyl terminated | Hydride 4 | 1.40 | 2,080 | 0 | 0 | 97 | 99 | 3 | 1 |
| Phenylhydrocyclosiloxanes | Hydride 5 | 1.56 | 367-611[d] | 50 | | 0 | | 50 | |
| 1,3-Diphenyl-1,1,3,3-tetrakis(dimethylsiloxy)disiloxane | Hydride 6 | 1.44 | 527[d] | 14 | | 57 | | 29 | |

[a]ID = identifier. Names and numbers are given for vinyl polysiloxanes and hydrido silicon compounds. Vinyl 1 bears no aryl groups; Vinyls 2-5 are aryl vinyl polysiloxanes. Hydride 4 bears no aryl groups; Hydrides 1-3, 5, and 6 are aryl hydrido silicon compounds.

[b]RI = refractive index measured by Abbe refractometer.

[c]Mole percent (Mol %) is given for phenyl, methyl, vinyl, and hydrogen groups, and is calculated based on the total of all organic groups bound to silicon in a given compound, taken as 100 mol %.

[d]Compounds are well-defined single small molecules, or mixtures of well-defined small molecules.

TABLE 2

Hydrosilation catalysts used in the Experimental Examples.

| Hydrosilation Catalyst | ID[a] |
|---|---|
| Platinum divinyltetramethyl-disiloxane complex (Karstedt) | HSC-1 |
| Platinum Carbonyl Cyclovinylmethylsiloxane complex (Ossko) | HSC-2 |
| Platinum Octanal/Octanol Complex (Lamoreaux) | HSC-3 |

[a]ID = identifier. HSC means hydrosilation catalyst.

TABLE 3

CIE analysis of heat aged cured polysiloxane compositions having zero or low levels of phenyl groups.

| Sample[a] | Vinyl polysiloxane | Hydrido silicon compound | Equiv.[b] Si—H | Hydrosilation catalyst | Pt (ppm) | CIE Color[c], post cure | | | CIE Color, 67 hrs @ 200° C. | | | CIE Color, 2 weeks @ 200° C. | | |
|---|---|---|---|---|---|---|---|---|---|---|---|---|---|---|
| | | | | | | L | a | b | L | a | b | L | a | b |
| C1 | Vinyl 1 | Hydride 4 | 1.05 | HSC-1 | 9.9 | 83.07 | −1.05 | −0.72 | 79.82 | −1.26 | 2.60 | 76.99 | −1.12 | 2.24 |
| C2 | Vinyl 1 | Hydride 4 | 1.05 | HSC-1 | 5.1 | 83.04 | −1.03 | −0.64 | 81.25 | −1.19 | 2.93 | 77.21 | −1.04 | 0.93 |
| C3 | Vinyl 1 | Hydride 4 | 1.05 | HSC-1 | 1.0 | 83.85 | −1.09 | −0.58 | 82.83 | −1.22 | 2.31 | 77.47 | −0.98 | 0.59 |
| C4 | Vinyl 1 | Hydride 4 | 1.05 | HSC-1 | 0.46 | 68.55 | −0.71 | 0.08 | 63.18 | −0.62 | 1.03 | 64.13 | −0.47 | 0.81 |
| C5 | Vinyl 2 | Hydride 2 | 2 | HSC-1 | 9.9 | 87.77 | −1.40 | 3.74 | 83.85 | −1.59 | 14.47 | 82.35 | −1.83 | 17.80 |
| C6 | Vinyl 2 | Hydride 2 | 2 | HSC-1 | 5.1 | 81.80 | −1.19 | 1.67 | 76.99 | −1.22 | 4.06 | 85.54 | −1.68 | 4.32 |
| 1 | Vinyl 2 | Hydride 2 | 2 | HSC-1 | 1.0 | 84.09 | −1.01 | −0.19 | 87.88 | −1.10 | 0.31 | 83.39 | −1.10 | 0.03 |
| 2 | Vinyl 2 | Hydride 2 | 2 | HSC-1 | 0.46 | 87.36 | −1.06 | −0.07[d] | 86.92 | −1.15 | 0.03 | 86.44 | −1.10 | 0.08 |

[a]Cured polysiloxane compositions C1-C4 contain no phenyl groups. (b) Cured polysiloxane compositions C5, C6, 1, and 2 contain a low level of phenyl groups.

[b]Equivalents of Si—H per equivalent of Si-vinyl.

[c]CIE readings are single observations of a specimen having a path length through the cured polysiloxane composition of ~0.6 mm.

[d]Average of three measurements, having standard deviation of approximately +/−0.05.

TABLE 4

CIE analysis of heat aged cured polysiloxane compositions: hydrido silicon compound and platinum level variants.

| Sample | Vinyl polysiloxane | Hydrido silicon compound | Equiv.[a] Si—H | Hydrosilation catalyst | Pt (ppm) | CIE Color[b], post cure | | | CIE Color, 67 hrs @ 200° C. | | | CIE Color, 2 weeks @ 200° C. | | |
|---|---|---|---|---|---|---|---|---|---|---|---|---|---|---|
| | | | | | | L | a | b | L | a | b | L | a | b |
| C7 | Vinyl 3 | Hydride 2 | 2 | HSC-1 | 9.9 | 82.73 | −1.08 | 2.15 | 80.22 | −1.00 | 15.44 | 76.76 | −1.94 | 14.70 |
| C8 | Vinyl 3 | Hydride 2 | 2 | HSC-1 | 5.1 | 85.66 | −1.11 | 2.63 | 81.27 | −1.05 | 19.80 | 79.91 | −2.36 | 13.30 |
| 3 | Vinyl 3 | Hydride 2 | 2 | HSC-1 | 2.5 | 86.18 | −1.10 | 0.37 | 86.57 | −1.24 | 0.78 | 86.89 | −1.25 | 1.04 |
| 4 | Vinyl 3 | Hydride 2 | 2 | HSC-1 | 1.0 | 86.45 | −1.08 | 0.19 | 86.72 | −1.24 | 0.60 | 86.84 | −1.23 | 0.73 |
| 5 | Vinyl 3 | Hydride 2 | 2 | HSC-1 | 0.46 | 86.45 | −1.07 | 0.04 | 86.77 | −1.09 | 0.21 | 86.76 | −1.19 | 0.19 |
| 6 | Vinyl 3 | Hydride 2 | 2 | HSC-1 | 0.23 | 85.75 | −1.08 | 0.07 | 86.77 | −1.17 | 0.21 | 86.04 | −1.24 | 0.39 |
| 7 | Vinyl 3 | Hydride 2 | 2 | HSC-1 | 0.12 | 85.60 | −0.99 | 0.30 | 86.01 | −1.19 | 0.26 | 84.92 | −1.21 | 0.61 |
| 8[c] | Vinyl 3 | Hydride 2 | 2 | HSC-1 | 0.05 | 84.41 | −1.09 | 0.14 | 85.20 | −1.18 | 0.19[c] | 85.71 | −1.38 | 1.25 |
| C9 | Vinyl 3 | Hydride 1 | 2 | HSC-1 | 9.9 | 86.29 | −1.14 | 1.37 | 83.89 | −1.50 | 10.26 | 84.76 | −2.04 | 12.53 |
| C10 | Vinyl 3 | Hydride 1 | 2 | HSC-1 | 5.1 | 83.87 | −0.93 | 0.53 | 84.67 | −1.23 | 2.63 | 81.73 | −1.39 | 3.84 |
| 9 | Vinyl 3 | Hydride 1 | 2 | HSC-1 | 2.5 | 85.52 | −1.10 | 0.15 | 84.85 | −1.14 | 1.85 | 83.69 | −1.12 | 1.67 |
| 10 | Vinyl 3 | Hydride 1 | 2 | HSC-1 | 1.0 | 84.38 | −1.06 | 0.33 | 86.57 | −1.27 | 0.65 | 85.83 | −1.08 | 1.18 |
| 11 | Vinyl 3 | Hydride 1 | 2 | HSC-1 | 0.46 | 85.12 | −1.06 | 0.27 | 86.78 | −1.33 | 0.83 | 85.77 | −1.36 | 1.16 |
| 12 | Vinyl 3 | Hydride 1 | 2 | HSC-1 | 0.23 | 85.27 | −1.13 | 0.18 | 85.81 | −1.25 | 0.84 | 84.88 | −1.29 | 0.77 |
| C11 | Vinyl 3 | Hydride 5 | 2 | HSC-1 | 9.9 | 84.79 | −0.89 | 1.69 | 86.12 | −1.26 | 5.42 | 75.80 | −0.86 | 9.31 |
| C12 | Vinyl 3 | Hydride 5 | 2 | HSC-1 | 5.1 | 84.99 | −0.69 | 2.94 | 87.00 | −1.20 | 1.84 | 74.99 | −0.92 | 2.00 |
| 13 | Vinyl 3 | Hydride 5 | 2 | HSC-1 | 2.5 | 77.66 | −0.67 | 0.48 | 84.55 | −1.00 | 1.20 | 77.36 | −0.72 | 0.75 |
| 14 | Vinyl 3 | Hydride 5 | 2 | HSC-1 | 1.0 | 87.15 | −1.07 | 0.21 | 86.45 | −1.13 | 1.69 | 75.98 | −0.80 | 2.07 |
| 15 | Vinyl 3 | Hydride 5 | 2 | HSC-1 | 0.46 | 86.85 | −1.11 | 0.04 | 87.10 | −1.19 | 0.46 | 88.27 | −1.11 | 0.54 |
| 16 | Vinyl 3 | Hydride 5 | 2 | HSC-1 | 0.23 | 87.44 | −1.02 | 0.02 | 87.76 | −1.02 | 0.20 | 86.97 | −1.20 | 1.54 |

[a]Equivalents of Si—H per equivalent of Si-vinyl.

[b]CIE readings are single observations of a specimen having a path length through the cured polysiloxane composition of ~0.6 mm.

[c]Sample was still tacky after 67 hrs at 200° C., indicating partial cure.

TABLE 5

CIE color analysis: values for b coordinates as a function of Pt level and time during 200° C. heat aging of cured aryl polysiloxane compositions.

| Sample | Vinyl polysiloxane | Hydrido silicon compound | Equiv.[a] Si—H | Hydrosilation catalyst | Pt (ppm) | values for CIE b coordinate[b] | | | | |
|---|---|---|---|---|---|---|---|---|---|---|
| | | | | | | 0 days[c] | 3 days | 7 days | 14 days | 31 days |
| C7 | Vinyl 3 | Hydride 2 | 2 | HSC-1 | 9.9 | 2.15 | 15.44 | 14.5 | 14.7 | 13.3 |
| C8 | Vinyl 3 | Hydride 2 | 2 | HSC-1 | 5.1 | 2.63 | 19.8 | 22.05 | 13.3 | 13.6 |
| 3 | Vinyl 3 | Hydride 2 | 2 | HSC-1 | 2.5 | 0.37 | 0.78 | 0.8 | 1.04 | 1.03 |
| 4 | Vinyl 3 | Hydride 2 | 2 | HSC-1 | 1.0 | 0.19 | 0.6 | 0.66 | 0.73 | 0.63 |
| 5 | Vinyl 3 | Hydride 2 | 2 | HSC-1 | 0.46 | 0.04 | 0.21 | 0.14 | 0.19 | 0.14 |
| 6 | Vinyl 3 | Hydride 2 | 2 | HSC-1 | 0.23 | 0.07 | 0.21 | 0.34 | 0.39 | 0.40 |

[a]Equivalents of Si—H per equivalent of Si-vinyl.
[b]CIE readings are single observations of a specimen having a path length through the cured polysiloxane composition of ~0.6 mm.
[c]0, 3, 7, 14, and 31 days correspond to 0 and approximately 72, 168, 336, and 744 hours, respectively.

TABLE 6

CIE analysis of heat aged cured polysiloxane compositions: varied hydrosilation catalyst type.

| Sample | Vinyl polysiloxane | Hydrido silicon compound | Equiv.[a] Si—H | Hydrosilation catalyst[b] | Pt (ppm) | CIE Color[c], post cure | | | CIE Color, 67 hrs @ 200° C. | | | CIE Color, 2 weeks @ 200° C. | | |
|---|---|---|---|---|---|---|---|---|---|---|---|---|---|---|
| | | | | | | L | a | b | L | a | b | L | a | b |
| C13 | Vinyl 3 | Hydride 2 | 2 | HSC-2 | 9.9 | 84.88 | −1.10 | 2.38 | 83.27 | −1.56 | 13.55 | 84.34 | −2.37 | 12.10 |
| C14 | Vinyl 3 | Hydride 2 | 2 | HSC-2 | 5.1 | 85.79 | −0.98 | 0.88 | 86.48 | −1.52 | 3.81 | 87.34 | −1.71 | 3.43 |
| 17 | Vinyl 3 | Hydride 2 | 2 | HSC-2 | 2.5 | 84.95 | −1.07 | 0.01 | 87.06 | −1.20 | 0.15 | 88.15 | −1.19 | 1.06 |
| 18 | Vinyl 3 | Hydride 2 | 2 | HSC-2 | 1.0 | 85.25 | −0.98 | 0.09 | 85.51 | −1.19 | 0.46 | 84.45 | −1.32 | 0.72 |
| 19 | Vinyl 3 | Hydride 2 | 2 | HSC-2 | 0.46 | 85.64 | −1.04 | 0.07 | 86.27 | −1.22 | 0.22 | 86.62 | −1.23 | 0.65 |
| C15 | Vinyl 3 | Hydride 2 | 2 | HSC-3 | 9.9 | 85.60 | −0.96 | 0.78 | 86.76 | −1.71 | 6.81 | 84.44 | −1.82 | 5.89 |
| C16 | Vinyl 3 | Hydride 2 | 2 | HSC-3 | 5.1 | 85.84 | −0.94 | 0.29 | 86.80 | −1.51 | 3.41 | 86.82 | −1.58 | 2.97 |
| 20 | Vinyl 3 | Hydride 2 | 2 | HSC-3 | 2.5 | 85.84 | −1.01 | 0.07 | 86.85 | −1.26 | 0.94 | 87.25 | −1.31 | 1.06 |
| 21 | Vinyl 3 | Hydride 2 | 2 | HSC-3 | 1.0 | 85.92 | −0.98 | 0.02 | 87.40 | −1.26 | 0.49 | 87.22 | −1.25 | 0.76 |
| 22 | Vinyl 3 | Hydride 2 | 2 | HSC-3 | 0.46 | 85.37 | −0.96 | 0.05 | 86.60 | −1.18 | 0.25 | 86.66 | −1.24 | 0.41 |

[a]Equivalents of Si—H per equivalent of Si-vinyl.
[b]Cured polysiloxane compositions C13, C14, and 17-19 were cured using platinum carbonyl cyclovinylmethylsiloxane complex (Ossko); and cured polysiloxane compositions C15, C16, and 20-22 were cured using platinum octanal/octanol complex (Lamoreaux).
[c]CIE readings are single observations of a specimen having a path length through the cured polysiloxane composition of ~0.6 mm.

TABLE 7

CIE analysis of heat aged cured polysiloxane compositions: vinyl/hydride ratio and Pt level variants.

| Sample | Vinyl polysiloxane | Hydrido silicon compound | Equiv.[a] Si—H | Hydrosilation catalyst | Pt (ppm) | CIE Color[b], post cure | | | CIE Color, 67 hrs @ 200° C. | | | CIE Color, 2 weeks @ 200° C. | | |
|---|---|---|---|---|---|---|---|---|---|---|---|---|---|---|
| | | | | | | L | a | b | L | a | B | L | a | b |
| 23 | Vinyl 3 | Hydride 2 | 1 | HSC-1 | 0.46 | 85.53 | −1.06 | 0.25 | 86.83 | −1.24 | 0.41 | 87.27 | −1.40 | 1.11 |
| 24 | Vinyl 3 | Hydride 2 | 1.5 | HSC-1 | 0.46 | 83.83 | −1.01 | 0.04 | 86.33 | −1.21 | 0.63 | 86.11 | −1.24 | 0.76 |
| 25 | Vinyl 3 | Hydride 2 | 2 | HSC-1 | 0.46 | 86.70 | −1.08 | 0.26 | 87.37 | −1.22 | 0.26 | 87.73 | −1.17 | 0.54 |
| 26 | Vinyl 3 | Hydride 2 | 2.5 | HSC-1 | 0.46 | 85.18 | −0.98 | 0.33 | 84.88 | −1.16 | 0.45 | 86.50 | −1.18 | 0.80 |
| 27 | Vinyl 3 | Hydride 2 | 3 | HSC-1 | 0.46 | 84.68 | −1.10 | −0.23 | 83.74 | −1.20 | −0.02 | 85.96 | −1.20 | 0.47 |
| 28 | Vinyl 3 | Hydride 2 | 1 | HSC-1 | 1.8 | 85.94 | −1.11 | 0.43 | 87.07 | −1.44 | 1.10 | 86.22 | −1.44 | 1.81 |
| 29 | Vinyl 3 | Hydride 2 | 1.5 | HSC-1 | 1.8 | 84.38 | −1.04 | 0.53 | 86.35 | −1.40 | 1.30 | 87.23 | −1.39 | 1.56 |
| 30 | Vinyl 3 | Hydride 2 | 2 | HSC-1 | 1.8 | 85.91 | −0.99 | 0.32 | 86.00 | −1.35 | 1.03 | 87.36 | −1.32 | 1.28 |
| 31 | Vinyl 3 | Hydride 2 | 2.5 | HSC-1 | 1.8 | 91.76 | −1.05 | 0.43 | 86.48 | −1.42 | 1.35 | 86.77 | −1.40 | 1.18 |
| 32 | Vinyl 3 | Hydride 2 | 3 | HSC-1 | 1.8 | 83.41 | −1.02 | 0.14 | 81.81 | −1.27 | 0.89 | 94.58 | −1.60 | 0.69 |

[a]Equivalents of Si—H per equivalent of Si-vinyl.
[b]CIE readings are single observations of a specimen having a path length through the cured polysiloxane composition of ~0.6 mm.

TABLE 8

CIE analysis of heat aged cured polysiloxane compositions: Pt level variants.

| Sample | Vinyl polysiloxane | Hydrido silicon compound | Equiv.[a] Si—H | Hydrosilation catalyst | Pt (ppm) | CIE Color[b], post cure | | | CIE Color, 96 hrs @ 200° C. | | | CIE Color, 192 hrs @ 200° C. | | |
|---|---|---|---|---|---|---|---|---|---|---|---|---|---|---|
| | | | | | | L | a | b | L | A | B | L | a | b |
| C17 | Vinyl 3 | Hydride 3 | 2 | HSC-1 | 10 | 86.19 | −0.97 | 0.49 | 84.87 | −1.12 | 5.97 | 83.69 | −1.30 | 8.64 |
| C18 | Vinyl 3 | Hydride 3 | 2 | HSC-1 | 5 | 86.08 | −1.00 | 0.27 | 86.84 | −1.09 | 2.09 | 84.97 | −1.21 | 2.63 |
| 33 | Vinyl 3 | Hydride 3 | 2 | HSC-1 | 1 | 85.60 | −0.96 | 0.06 | 87.24 | −1.04 | 0.61 | 85.35 | −1.09 | 0.57 |
| 34 | Vinyl 3 | Hydride 3 | 2 | HSC-1 | 0.5 | 87.52 | −0.97 | 0.02 | 86.69 | −0.95 | 0.01 | 84.31 | −1.03 | 0.09 |
| 35 | Vinyl 3 | Hydride 3 | 2 | HSC-1 | 0.25 | 87.40 | −0.95 | 0.06 | 87.37 | −0.96 | 0.00 | 86.10 | −1.04 | 0.30 |
| 36 | Vinyl 3 | Hydride 3 | 2 | HSC-1 | 0.1 | 87.60 | −0.93 | 0.17 | 87.60 | −0.93 | 0.17 | 85.79 | −1.04 | 0.05 |
| 37 | Vinyl 3 | Hydride 3 | 2 | HSC-1 | 0.05 | 87.41 | −0.91 | 0.18 | 85.67 | −0.98 | 0.04 | 86.76 | −1.02 | 0.27 |
| 38 | Vinyl 3 | Hydride 3 | 2 | HSC-1 | 0.01 | 86.66 | −1.00 | 0.23 | 86.77 | −0.99 | 0.10 | 86.26 | −1.03 | 0.16 |

[a]Equivalents of Si—H per equivalent of Si-vinyl.
[b]CIE readings are single observations of a specimen having a path length through the cured polysiloxane composition of ~0.6 mm.

TABLE 9

CIE analysis of heat aged cured polysiloxane compositions: CIE b values as a function of Pt level variants.

| Sample | Vinyl polysiloxane | Hydrido silicon compound | Equiv.[a] Si—H | Hydrosilation catalyst | Pt (ppm) | CIE b values[b] for cured samples heat aged @ 200° C. | | | | |
|---|---|---|---|---|---|---|---|---|---|---|
| | | | | | | 0 hrs | 96 hrs | 192 hrs | 329 hrs | 930 hrs |
| C17 | Vinyl 3 | Hydride 3 | 2 | HSC-1 | 10 | 0.49 | 5.97 | 8.62 | 8.63 | 16.17 |
| C18 | Vinyl 3 | Hydride 3 | 2 | HSC-1 | 5 | 0.27 | 2.09 | 2.63 | 4.22 | 7.36 |
| 33 | Vinyl 3 | Hydride 3 | 2 | HSC-1 | 1 | 0.06 | 0.61 | 0.57 | 0.70 | 0.58 |
| 34 | Vinyl 3 | Hydride 3 | 2 | HSC-1 | 0.5 | 0.02 | 0.01 | 0.09 | 0.61 | 0.25 |
| 35 | Vinyl 3 | Hydride 3 | 2 | HSC-1 | 0.25 | 0.06 | 0 | 0.30 | 0.49 | 0.28 |
| 36 | Vinyl 3 | Hydride 3 | 2 | HSC-1 | 0.1 | 0.17 | 0.17 | 0.05 | 0.06 | 0.73 |
| 37 | Vinyl 3 | Hydride 3 | 2 | HSC-1 | 0.05 | 0.18 | 0.04 | 0.27 | 0.52 | 0.41 |
| 38 | Vinyl 3 | Hydride 3 | 2 | HSC-1 | 0.01 | 0.23 | 0.10 | 0.16 | 0.25 | 0.12 |
| 39 | Vinyl 3 | Hydride 3 | 2 | HSC-1 | 0.005 | 0.24 | 0.32 | 0.27 | 0.25 | 0.31 |

[a]Equivalents of Si—H per equivalent of Si-vinyl.
[b]CIE readings are single observations of a specimen having a path length through the cured polysiloxane composition of ~0.6 mm.

TABLE 10

CIE analysis of heat aged cured polysiloxane compositions: CIE b and UV-visible values as a function of Pt level variants.

| Sample | Vinyl polysiloxane | Hydrido silicon compound | Equiv.[a] Si—H | Hydrosilation catalyst | Pt (ppm) | CIE b values[b] for cured samples heat aged @ 200° C. | | UV-visible spectrum cut-off wavelength (nm) for cured samples heat aged @ 200° C. |
|---|---|---|---|---|---|---|---|---|
| | | | | | | 0 hrs | 192 hrs | 192 hrs |
| C17 | Vinyl 3 | Hydride 3 | 2 | HSC-1 | 10 | 0.49 | 8.62 | 331 |
| C18 | Vinyl 3 | Hydride 3 | 2 | HSC-1 | 5 | 0.27 | 2.63 | 315 |
| 33 | Vinyl 3 | Hydride 3 | 2 | HSC-1 | 1 | 0.06 | 0.57 | 299 |

[a]Equivalents of Si—H per equivalent of Si-vinyl.
[b]CIE readings are single observations of a specimen having a path length through the cured polysiloxane composition of ~0.6 mm.

TABLE 11

Visual Inspection of heat aged cured polysiloxane compositions: Pt level variants.

| Sample | Vinyl polysiloxane | Hydrido silicon compound | Equiv.[a] Si—H | Hydrosilation catalyst | Pt (ppm) | Appearance after Curing | Visual inspection path length, mm | Heat aging time at 200° C., hours | Appearance after heat aging - 1.8 cm path length[b] |
|---|---|---|---|---|---|---|---|---|---|
| C21 | Vinyl 4 | Hydride 2 | 1.2 | HSC-1 | 20 | Clear | ~2 | 4 | brown |
| 40 | Vinyl 4 | Hydride 2 | 1 | HSC-1 | 4.6 | Clear | 10 | 24 | very slight brown tint |

[a]Equivalents of Si—H per equivalent of Si-vinyl.
[b]Samples were cured in glass microbeakers with a diameter of 1.8 cm

TABLE 12

Visual Inspection of post-treated polysiloxane compositions after heat aging.

| Sample | Vinyl polysiloxane | Hydrido silicon compound | Equiv.[a] Si—H | Hydrosilation catalyst | Pt (ppm) | Appearance after Curing | Heat aging time at 200° C., hours | Post-treatment strategy | Color after aging - 1.8 cm path length[b] |
|---|---|---|---|---|---|---|---|---|---|
| C22 | Vinyl 5 | Hydride 6 | 1.7 | HSC-1 | 18 | Clear | 24 | No post-cure treatment | brown |
| 41 | Vinyl 5 | Hydride 6 | 1.2 | HSC-1 | 18 | Clear | 88 | Extracted with hexanes and toluene for 2 hrs at RT | light brown/yellow |
| 42 | Vinyl 5 | Hydride 6 | 1.2 | HSC-1 | 18 | Clear | 88 | Extracted with hexanes, toluene, and 1 drop dodecanethiol for 2 hrs at RT | light brown/yellow |
| 43 | Vinyl 5 | Hydride 6 | 1.2 | HSC-1 | 18 | Clear | 88 | Treated with toluene and ammonium hydroxide for 2 hrs at RT, then extracted solvent | light brown/yellow |
| 44 | Vinyl 5 | Hydride 6 | 1.2 | HSC-1 | 18 | Clear | 88 | Treated with phenylsilane and toluene for 1.5 hrs at 100° C., boiled off toluene and phenylsilane | light brown/yellow |

[b]Equivalents of Si—H per equivalent of Si-vinyl.
[c]Samples were cured in glass microbeakers with a diameter of 1.8 cm

TABLE 13

Integrated absorption in near-UV region (300-380 nm) as a function of Pt level and time during 200° C. heat aging of cured aryl polysiloxane compositions.

| Sample | Vinyl polysiloxane | Hydrido silicon compound | Equiv.[a] Si—H | Hydrosilation catalyst | Pt (ppm) | Integrated absortion at 300-380 nm | | | | | |
|---|---|---|---|---|---|---|---|---|---|---|---|
| | | | | | | 0 days[b] | 7 days | 14 days | 21 days | 28 days | 49 days |
| C7 | Vinyl 3 | Hydride 2 | 2 | HSC-1 | 9.9 | 4.6 | 8.9 | 11.5 | 18.2 | 35.2 | 38.9 |
| C8 | Vinyl 3 | Hydride 2 | 2 | HSC-1 | 5.1 | 3.2 | 9.5 | 10.3 | 15.3 | 22.3 | 32.1 |
| 3 | Vinyl 3 | Hydride 2 | 2 | HSC-1 | 2.5 | 1.2 | 8.3 | 9.8 | 14.4 | 20.9 | 31.9 |
| 4 | Vinyl 3 | Hydride 2 | 2 | HSC-1 | 1.0 | 0.9 | 4.1 | 5.9 | 10.5 | 18.2 | 25.8 |
| 5 | Vinyl 3 | Hydride 2 | 2 | HSC-1 | 0.46 | 0.9 | 6.5 | 7.1 | 9.9 | 12.9 | 17.8 |
| 6 | Vinyl 3 | Hydride 2 | 2 | HSC-1 | 0.23 | 0.6 | 0.9 | 2.3 | 4.6 | 8.7 | 10.1 |

[a]Equivalents of Si—H per equivalent of Si-vinyl.
[b]0, 7, 14, 21, 28, and 49 days correspond to 0 and approximately 168, 336, 504, 672 and 1176 hours, respectively.

Explanation of the Tables. Table A lists the types and amounts of vinyl polysiloxane, hydrido silicon compound, and hydrosilation catalysts utilized for each curable aryl siloxane composition. Table 1 lists name, refractive index, $M_n$, and amounts of silicon bonded organic groups phenyl, methyl, and vinyl for vinyl polysiloxanes 1-5 (i.e., Vinyl #1 through Vinyl #5). Table 1 further lists name, refractive index, $M_n$, and amounts of silicon bonded organic groups phenyl, methyl, and vinyl for hydrido silicon compounds 1-6 (i.e., Hydride #1 through Hydride #6). Table 2 lists the names of hydrosilation catalysts 1-3 (i.e., HSC-1 through HSC-3). Tables 3-10 list results of CIE analytical measurements made on a variety of cured aryl polysiloxane compositions before and after heat aging at 200° C. in air for a variety of time intervals. The CIE "b" coordinate particularly reflects the appearance of a brown/yellow color in the samples. As such, the "b" coordinate is shown in bold type to emphasize the importance of the "b" coordinate throughout Tables 3-10. In general, b values higher than 2.0 are visually detectable as a brown color in these formulations. This is the case with all the examples presented. Table 10 further lists results of UV-visible spectroscopic measurements, compared with CIE b-values. Tables 11 and 12 lists results of visual inspection of cured aryl polysiloxane compositions before and after heat aging. Table 13 lists results for UV-visible spectroscopic measurements focusing on the near-UV region.

Test Results. Samples were aged in ovens at 200° C. under an air atmosphere (see heat aging method supra) unless otherwise specified. Not all formulations aged well—some formulations cracked, shrank, exhibited wrinkled surfaces, or delaminated from the glass slides or microbeakers. Not all formulations have optimal mechanical properties, but they are included because they illustrate the breadth of samples amenable to color prevention according to the present invention.

CIE analysis for heat aged cured aryl polysiloxane compositions. Samples were aged at 200° C. and CIE Lab, determined using CIE L*a*b* (1976) test method, were periodically taken to observe the effect of platinum catalyst levels on the color of the samples. Table 3 shows the change in the CIE b coordinate (b value) over time at 200° C. in air. The cured polysiloxane composition containing no silicon bonded phenyl groups has a b value of slightly more than 2.0 after 2 weeks, while the cured aryl polysiloxane displays high (undesirable) b values for Pt levels of 5.1 ppm after just 67 hours (see samples C5 and C6). Lower Pt levels of 1.0 and below show b values which are very low for samples containing silicon bonded aryl groups. Table 4 shows the trend in CIE b coordinates during heat aging over time intervals of 67 hours and 2 weeks for cured aryl polysiloxane compositions prepared from Vinyl #3 and each of Hydrides #2, and #1, and #5 using hydrosilation catalysts at corresponding Pt levels ranging from 9.9 down to as low as 0.23 ppm in all three cases, and as low as 0.05 ppm in one case. The CIE b values are consistently below 2.0 for platinum levels of equal to or less than 2.5 ppm. Table 5 shows that, for comparative samples C7 and C8, extremely high b values occur within 3 days of heat aging at 200° C. in air. It is important to note that the reduction in b values for comparative samples C7 and C8 is due, not to loss of color, but to sample damage rendering measurement of color difficult using the CIE method. Cured aryl polysiloxane compositions containing levels of hydrosilation catalyst having metal equivalent values of 2.5 ppm and below display CIE b values of equal to or less than 1 even after 31 days. Table 6 shows that the same color stability to heat aging at low hydrosilation catalyst level established in Tables 3-5 is achieved using other hydrosilation catalysts. In addition, consistent poor color stability is observed for Pt levels of 5.1 and 9.9 ppm with both hydrosilation catalysts. Table 7 reveals excellent color stability at 67 hours and 2 weeks for a range of ratios of silicon bonded hydrogen atom to silicon bonded vinyl. Table 8 again shows excellent color stability during heat aging for Pt levels of 0.01 to 1 in yet other cured aryl polysiloxane compositions, this time prepared using Vinyl #3 and Hydride #3. Table 9 expands the observations of Table 8 to an additional platinum level (i.e., 0.005 ppm) and to longer times (i.e., 329 hours and 930 hours). While b values are very high for Pt levels of 5 ppm and above at 930 hours (i.e., slightly more than 5.5 weeks), Pt levels of 1 ppm and below maintain excellent color stability (i.e., all b values are well below 1 even at 5.5 weeks).

UV-visible spectroscopic analysis for heat aged cured aryl polysiloxane compositions. UV-visible spectroscopic analysis was performed on selected samples heat aged at 200° C. in air. Table 10 shows a correlation between elevated CIE b values and movement of the UV-visible spectrum cut-off wavelength toward longer wavelengths, wherein the cut-off wavelength is the wavelength in the near UV region at which the absorbance first drops to a baseline value of 0.5 units. That is, as the wavelength of UV light is increased, the cut-off point is the first wavelength at which the absorbance has decreased to a value of 0.5. The Table 10 correlation indicates that devices that output light in the near UV, (e.g., UV-LED devices having near UV capability) also benefit from encapsulation by the cured aryl polysiloxane of the present invention. Table 13 also indicates that UV absorption in the near-UV (here, 300-380 nm) is decreased for low platinum levels. The Table 13 data points were obtained by integrating the area under the absorption curve between 300-380 nm, after doing a linear baseline correction (i.e., setting the 380 nm day 0 data point for each Pt level as zero absorption). This procedure corrects for differences between the samples (slightly thicker quartz slides, for instance).

Visual inspection analysis for heat aged cured aryl polysiloxane compositions. Two samples were compared visually and the results are given in Table 11. Comparative sample C21 was prepared using 20 ppm of platinum and heat aged at 200° C. for only 4 hours. A specimen having a thickness of only ~2 mm was inspected visually and found to be brown. In contrast, sample 40 was prepared using 4.6 ppm of platinum and heat aged at 200° C. for 24 hours. A specimen having a thickness of 10 mm (five times the thickness of the comparative specimen) was inspected visually and found to have a very slight brown tint. The results tabulated in Table 12 indicate that post-treatment of cured polysiloxane compositions can reduce the tendency of the cured polysiloxane compositions to discolor during accelerated heat aging. Samples C22 and 41-44 show that the amount of color produced at 200° C. can be reduced by extracting the platinum catalyst out of the cross-linked gel. For samples 41-44, all of the extracted or treated samples showed less color generation than the control sample C22. In D-G, the specific type of extraction or catalyst inactivation method used did not (by eye) make a difference in the amount of color seen, only the fact that an extraction was performed. For instance, ammonium hydroxide treatment seemed to work no better than toluene extraction in terms of reducing color formation. All of the treatments damaged the gel material, but they helped verify the principle that the Pt catalyst concentration plays a role in color formation at 200° C.

We claim:

1. A cured aryl polysiloxane composition comprising:
    A. an alkylene bridged aryl polysiloxane comprising:
        at least two silicon-bridging alkylene moieties; and
        from at least 30 mole percent to no more than 99.9 mole percent silicon bonded aryl groups, based on total moles of silicon bonded organic groups of the alkylene bridged aryl polysiloxane;
        and
    B. a hydrosilation catalyst,
    wherein
        the hydrosilation catalyst is a metal or metal compound comprising a Group VIII element selected from platinum, rhodium, palladium, and combinations thereof; and
        the hydrosilation catalyst, and any derivatives thereof, is present in a combined amount of at least 0.005 ppm to less than 0.6 ppm, expressed as a Group VIII element equivalent value, based on the weight of the cured aryl polysiloxane composition; and
    wherein the cured aryl polysiloxane composition does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured aryl polysiloxane composition after the heat aging.

2. The cured aryl polysiloxane composition of claim 1, wherein:
    the alkylene bridged aryl polysiloxane is represented by the average compositional formula I,

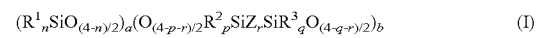

wherein:
    for each $(R^1{}_n SiO_{(4-n)/2})$ unit:
        subscript n equals independently 0, 1, 2, or 3;
    for each $(O_{(4-p-r)/2}R^2{}_p SiZ_r SiR^3{}_q O_{(4-q-r)/2})$ unit:
        subscript p equals 0, 1, 2, or 3;
        subscript q equals 0, 1, 2 or 3;
        p+q=0 to [8−(2r+1)];
        subscript r=1, 2, or 3;
        Z is selected from —CHR⁴CHR⁵—$X_s$, arylene, substituted arylene, and combinations thereof, wherein at least two Z groups are selected from CHR⁴CHR⁵—$X_s$—, wherein:
            —CHR⁴CHR⁵—$X_s$— is the silicon-bridging alkylene moiety;
            X is independently selected from methylene, phenyl, substituted phenyl, and combinations thereof;
            subscript s=0 or 1; and
            R⁴ and R⁵ are independently selected from hydrogen atom and alkyl;
        R¹, R², and R³ are selected from alkenyl, hydrogen atom, aryl, alkyl, hydroxy, alkoxy, aryloxy, other hydrocarbon radical, and combinations thereof;

subscripts a and b are selected to conform with the mole fraction of the $(R^1{}_n SiO_{(4-n)/2})$ unit and the $(O_{(4-p-r)/2}R^2{}_p SiZ_r SiR^3{}_q O_{(4-q-r)/2})$ unit, respectively;

$0 < a < 1$; $0 < b < 1$; and $a+b=1$.

3. The cured aryl polysiloxane composition of claim 2, wherein at least 70 mole percent to 100 mole percent of $R^1$, $R^2$, and $R^3$ combined are selected from vinyl, hydrogen atom, methyl, phenyl, naphthyl, phenoxyphenyl and combinations thereof.

4. A method of making the cured aryl polysiloxane composition of claim 1, comprising the steps of:
A. providing:
  i) an aryl alkenyl polysiloxane comprising:
    at least two silicon bonded alkenyl groups; and
    from at least 30 mole percent to no more than 99.9 mole percent silicon bonded aryl groups, based on total moles of silicon bonded organic groups of the aryl alkenyl polysiloxane;
  ii) a hydrido silicon compound comprising:
    at least two silicon bonded hydrogen atoms; and
    from 0 mole percent to no more than 99.9 mole percent of the silicon bonded aryl groups, based on total moles of silicon bonded organic groups of the hydrido siloxane compound; and
  iii) a hydrosilation catalyst;
B. combining the aryl alkenyl polysiloxane, the hydrido silicon compound, and the hydrosilation catalyst to produce a curable aryl siloxane composition;
C. curing the curable aryl siloxane composition to form the cured aryl polysiloxane composition; and
D. optionally, purifying the cured aryl polysiloxane composition by a technique comprising steps selected from: removing at least a portion of the hydrosilation catalyst; deactivating at least a portion of the hydrosilation catalyst; and combinations thereof,
wherein:
  the hydrosilation catalyst is a metal or metal compound comprising a Group VIII element selected from platinum, rhodium, palladium, and combinations thereof;
  the hydrosilation catalyst is present in an amount of at least 0.005 ppm to less than 0.6 ppm, expressed as a Group VIII element equivalent value, based on the weight of the curable aryl siloxane composition; and
  the cured aryl polysiloxane composition does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured aryl polysiloxane composition after the heat aging.

5. A method of making an encapsulated semiconductor device, comprising the steps of:
A. providing:
  i) an aryl alkenyl polysiloxane comprising:
    at least two silicon bonded alkenyl groups; and
    from at least 30 mole percent to no more than 99.9 mole percent silicon bonded aryl groups, based on total moles of silicon bonded organic groups of the aryl alkenyl polysiloxane;
  ii) a hydrido silicon compound comprising:
    at least two silicon bonded hydrogen atoms; and
    from 0 mole percent to no more than 99.9 mole percent of the silicon bonded aryl groups, based on total moles of silicon bonded organic groups of the hydrido siloxane compound; and
  iii) a hydrosilation catalyst;
B. combining the aryl alkenyl polysiloxane, the hydrido silicon compound, and the hydrosilation catalyst to produce a curable aryl siloxane composition;
C. curing the curable aryl siloxane composition to form a cured aryl polysiloxane composition comprising:
  i. an alkylene bridged aryl polysiloxane comprising: at least two silicon-bridging alkylene moieties; and from at least 30 mole percent to no more than 99.9 mole percent silicon bonded aryl groups, based on total moles of silicon bonded organic groups of the alkylene bridged aryl polysiloxane; and
  ii. the hydrosilation catalyst,
wherein
D. optionally, purifying the cured aryl polysiloxane composition by a technique comprising steps selected from: removing at least a portion of the hydrosilation catalyst; deactivating at least a portion of the hydrosilation catalyst; and combinations thereof,
wherein:
  the hydrosilation catalyst is a metal or metal compound comprising a Group VIII element selected from platinum, rhodium, palladium, and combinations thereof;
  the hydrosilation catalyst is present in the curable aryl siloxane composition and the cured aryl polysiloxane composition in an amount of at least 0.005 ppm to less than 0.6 ppm, expressed as a Group VIII element equivalent value, based on the weight of the curable aryl siloxane composition and the curable aryl polysiloxane composition, respectively; and
  the cured aryl polysiloxane composition does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured aryl polysiloxane composition after the heat aging;
E. providing a semiconductor device comprising semiconductor elements; and
F. forming a coating on at least one surface of at least one of the semiconductor elements by a technique comprising steps selected from:
  applying the curable aryl siloxane composition to the surface before or during the step of curing;
  applying the cured aryl polysiloxane composition to the surface; and combinations thereof.

6. The method of claim 4, wherein the aryl alkenyl polysiloxane is represented by the average compositional formula II, $$(R^6{}_3SiO_{1/2})_c(R^7{}_2SiO_{2/2})_d(R^8SiO_{3/2})_e(SiO_{4/2})_f \qquad (II)$$

wherein:
$R^6{}_3SiO_{1/2}$, $R^7{}_2SiO_{2/2}$, $R^8SiO_{3/2}$, and $SiO_{4/2}$ are, respectively, an M-unit, a D-unit, a T-unit, and a Q-unit, all of which are primary siloxane units;
subscripts c, d, e, and f are selected to conform with the mole fraction of $R^6{}_3SiO_{1/2}$, $R^7{}_2SiO_{2/2}$, $R^8SiO_{3/2}$, and $SiO_{4/2}$, respectively;
$0.001 \leq c \leq 1$; $0 \leq d \leq 0.999$; $0 \leq e \leq 0.50$; $0 \leq f \leq 0.10$;
$c+d+e+f=1$;
the silicon bonded alkenyl group is present in the aryl alkenyl polysiloxane in an amount of at least 0.1 mole percent to no more than 60 mole percent, based on total moles of the silicon bonded organic groups of the aryl alkenyl polysiloxane;

the silicon bonded aryl group is present in the aryl alkenyl polysiloxane in an amount of at least 10 mole percent to no more than 99.9 mole percent, based on total moles of the silicon bonded organic groups of the aryl alkenyl polysiloxane; and $R^6$-$R^8$ are selected from alkenyl, hydrogen atom, aryl, alkyl, hydroxy, alkoxy, aryloxy, other hydrocarbon radical, and combinations thereof.

7. The method of claim 4, wherein the hydrido silicon compound comprises a hydrido silicon compound selected from:

i) a hydrido silicon compound having the average compositional formula III, $$(R^9{}_3SiO_{1/2})_g(R^{10}{}_2SiO_{2/2})_h(R^{11}SiO_{3/2})_j(SiO_{4/2})_k \qquad (III),$$

wherein:

$R^9{}_3SiO_{1/2}$, $R^{10}{}_2SiO_{2/2}$, $R^{11}SiO_{3/2}$, and $SiO_{4/2}$ are, respectively, an M-unit, a D-unit, a T-unit, and a Q-unit, all of which are primary siloxane units;

subscripts g, h, j, and k are selected to conform with the mole fraction of $R^9{}_3SiO_{1/2}$, $R^{10}{}_2SiO_{2/2}$, $R^{11}SiO_{3/2}$, and $SiO_{4/2}$, respectively;

$0.001 \leq g \leq 1$; $0 \leq h \leq 0.999$; $0 \leq j \leq 0.50$; $0 \leq k \leq 0.10$; $g+h+j+k=1$;

the silicon bonded hydrogen atom is present in the hydrido silicon compound in an amount of at least 0.1 mole percent to no more than 60 mole percent, based on total moles of the silicon bonded organic groups of the hydrido siloxane compound;

the silicon bonded aryl group is present in the hydrido silicon compound in an amount of at least 10 mole percent to no more than 99.9 mole percent, based on total moles of the silicon bonded organic groups of the hydrido siloxane compound; and $R^9$-$R^{11}$ are selected from alkenyl, hydrogen atom, aryl, alkyl, hydroxy, alkoxy, aryloxy, other hydrocarbon radical, and combinations thereof; and ii) a hydrido silicon compound having the formula IV:

$$R^{12}{}_m SiH_{(4-m)} \qquad (IV)$$

wherein:

m=1, or 2; and $R^{12}$ is selected from alkenyl, aryl, alkyl, hydroxy, alkoxy, aryloxy, other hydrocarbon radical, and combinations thereof;

and combinations thereof.

8. An encapsulated semiconductor device, comprising semiconductor elements, wherein one or more of the semiconductor elements is coated with the cured aryl polysiloxane composition of claim 1.

* * * * *